(12) United States Patent
Kang et al.

(10) Patent No.: US 10,985,233 B2
(45) Date of Patent: Apr. 20, 2021

(54) DISPLAY DEVICE

(71) Applicant: Samsung Display Co., Ltd., Yongin-si (KR)

(72) Inventors: Kinyeng Kang, Yongin-si (KR); Taewoo Kim, Yongin-si (KR); Taehoon Yang, Yongin-si (KR); Seunghwan Cho, Yongin-si (KR); Jonghyun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/846,170

(22) Filed: Apr. 10, 2020

(65) Prior Publication Data

US 2020/0381506 A1 Dec. 3, 2020

(30) Foreign Application Priority Data

Jun. 3, 2019 (KR) .................... 10-2019-0065474

(51) Int. Cl.
*H01L 27/32* (2006.01)

(52) U.S. Cl.
CPC .................. *H01L 27/3276* (2013.01)

(58) Field of Classification Search
CPC .................................................. H01L 27/3276
See application file for complete search history.

(56) References Cited

U.S. PATENT DOCUMENTS

| 8,963,818 | B2 | 2/2015 | Kim et al. |
| 9,280,947 | B2 | 3/2016 | Kim et al. |
| 9,960,194 | B1 | 5/2018 | Park et al. |
| 10,147,777 | B2 | 12/2018 | Lim et al. |
| 2009/0096975 | A1 | 4/2009 | Kwon et al. |
| 2016/0377904 | A1* | 12/2016 | Shin .................. G09G 3/20 257/776 |
| 2017/0062408 | A1* | 3/2017 | Chung ............... G09G 3/3233 |
| 2017/0287936 | A1* | 10/2017 | Kim .................... H01L 27/124 |
| 2017/0337873 | A1* | 11/2017 | Kim .................. H01L 27/3258 |
| 2018/0188579 | A1 | 7/2018 | Jeong et al. |

(Continued)

FOREIGN PATENT DOCUMENTS

| CN | 107065336 A | 8/2017 |
| KR | 10-2012-0075762 A | 7/2012 |
| KR | 10-2014-0012271 A | 2/2014 |

(Continued)

OTHER PUBLICATIONS

Extended European Search Report for corresponding European Patent Application No. 20171448.2, dated Jun. 23, 2020, 6 pAGES.

*Primary Examiner* — Yu-Hsi D Sun
(74) *Attorney, Agent, or Firm* — Lewis Roca Rothgerber Christie LLP

(57) ABSTRACT

A display device includes: a substrate comprising a display area and a peripheral area outside the display area; a first connection line in the display area, the first connection line comprising a first portion extending along a first column of the display area and in the first column, a third portion extending along a second column of the display area and in the second column, and a second portion connecting the first portion to the third portion; and a second connection line in the peripheral area and connected to the third portion of the first connection line and a data line in a third column of the display area.

19 Claims, 25 Drawing Sheets

(56) References Cited

U.S. PATENT DOCUMENTS

2018/0331124 A1    11/2018  Cho et al.
2020/0273928 A1*   8/2020  Che ...................... G09G 3/3258

FOREIGN PATENT DOCUMENTS

| KR | 10-1820382 B1 | 1/2018 |
| KR | 10-2018-0047595 A | 5/2018 |
| KR | 10-2018-0079080 A | 7/2018 |
| KR | 10-2018-0125061 A | 11/2018 |

* cited by examiner

FIG. 21C
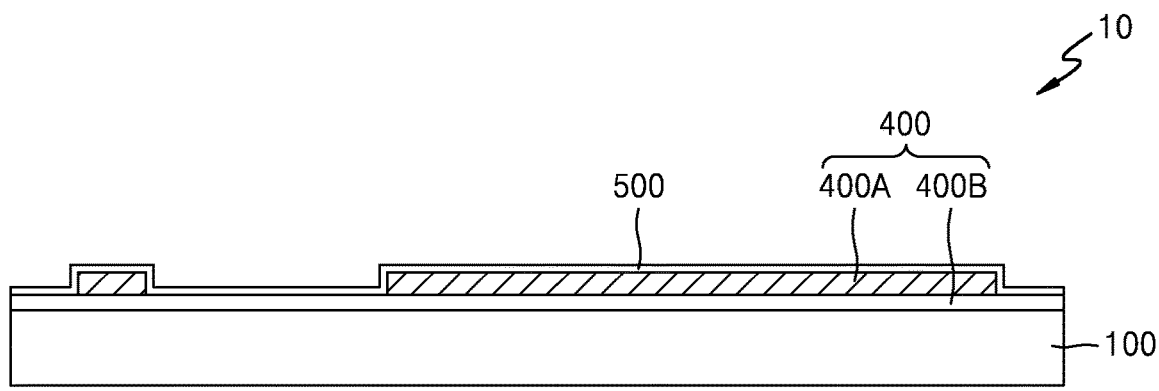
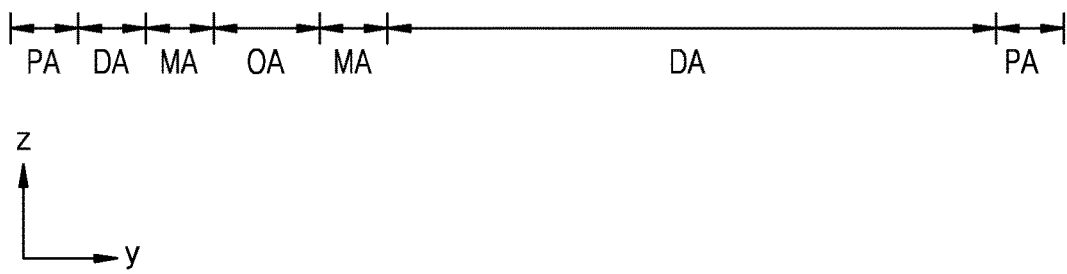
FIG. 21D
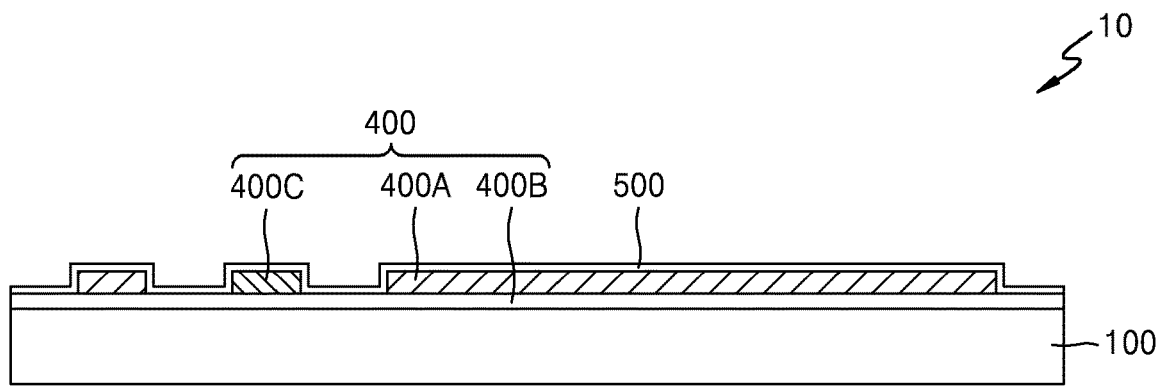
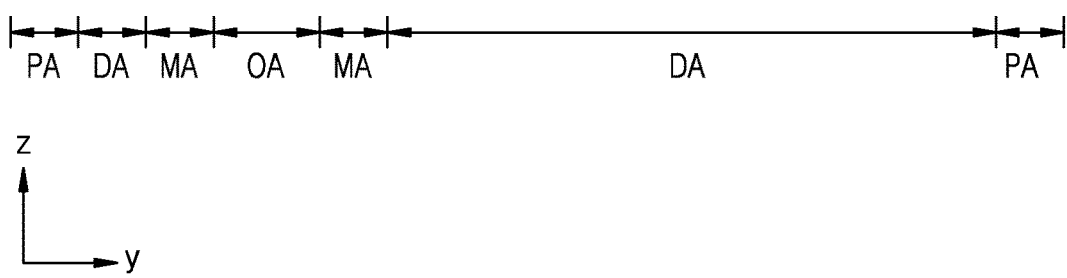

FIG. 22A
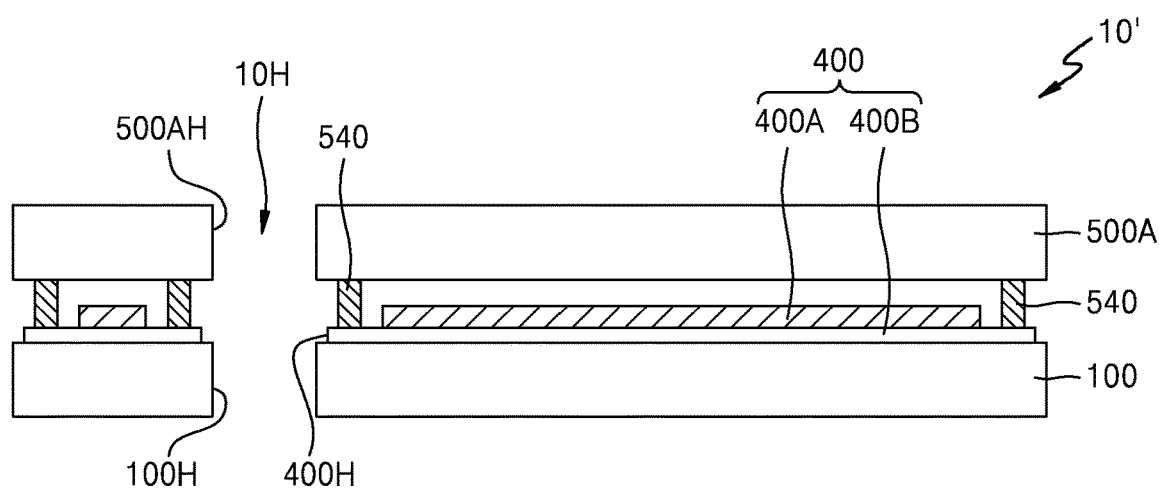
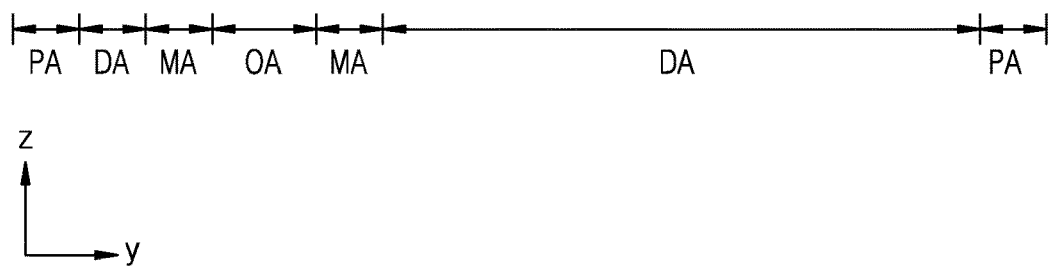
FIG. 22B
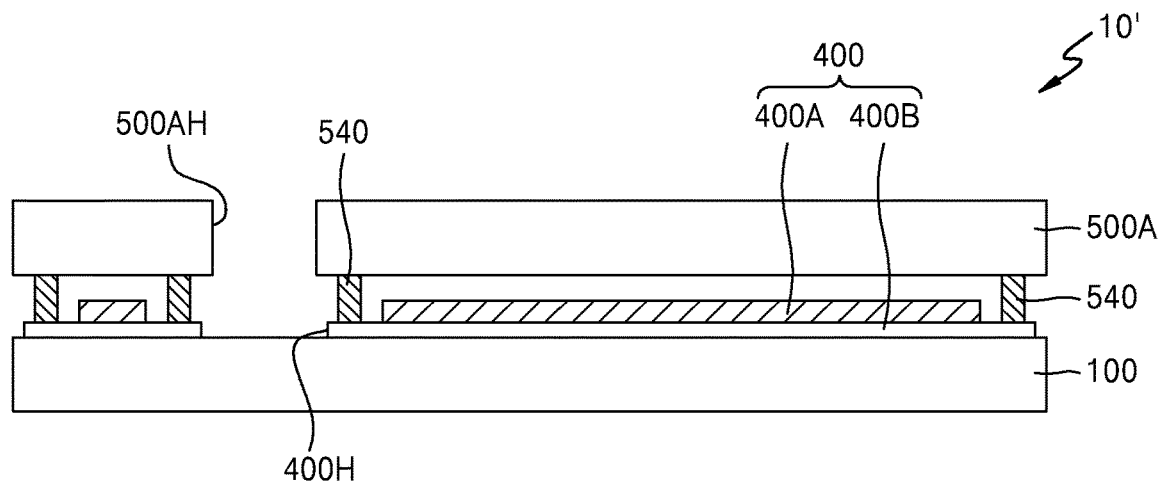
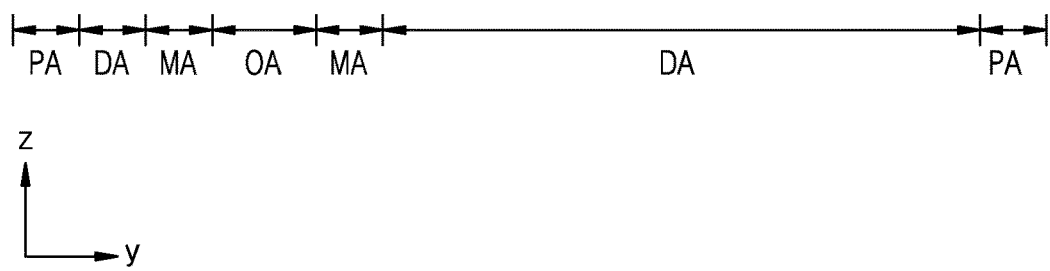

FIG. 22C
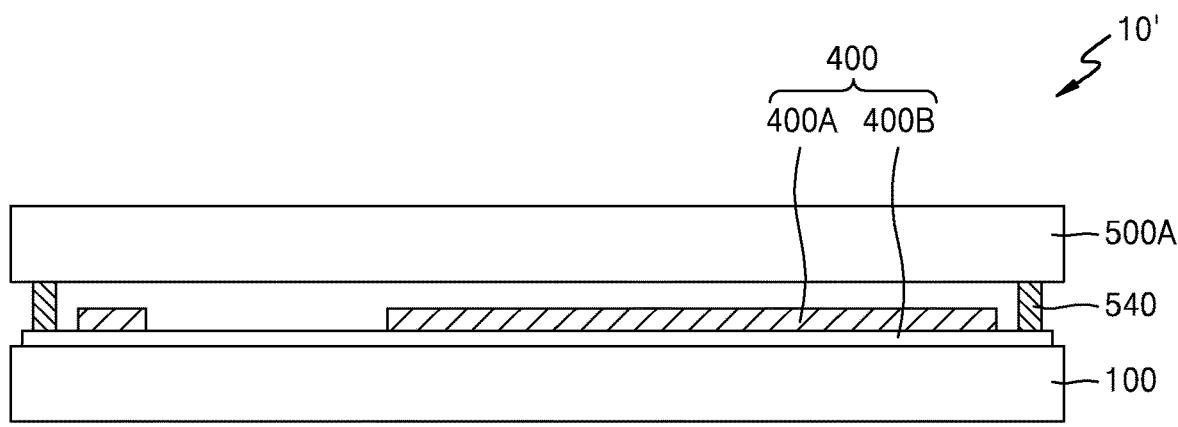
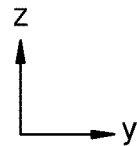
FIG. 22D
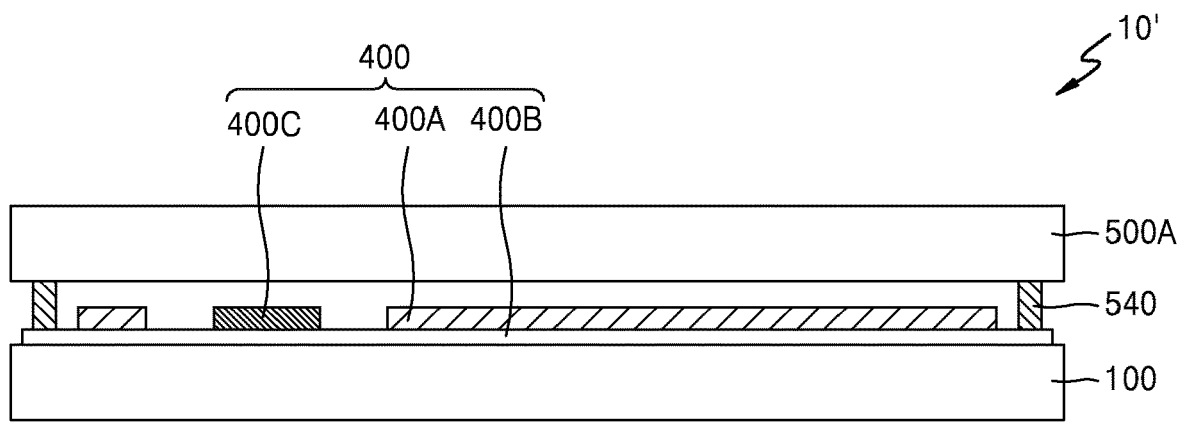
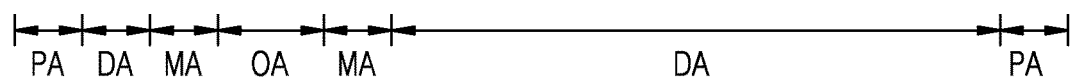
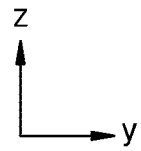

DISPLAY DEVICE

CROSS-REFERENCE TO RELATED APPLICATION

The present application claims priority to and the benefit of Korean Patent Application No. 10-2019-0065474, filed on Jun. 3, 2019, in the Korean Intellectual Property Office, the disclosure of which is incorporated herein in its entirety by reference.

BACKGROUND

1. Field

Aspects of one or more example embodiments relate to a display device.

2. Description of Related Art

Aspects of one or more example embodiments relate to various display devices having excellent characteristics such as thinness, light weight, and low power consumption have been introduced as the display field for visually expressing various electrical signal information has been rapidly developed. In addition, in recent years, physical buttons and the like have been removed from the front surface of a display device to reduce a dead area of the display device, and accordingly, the display area is increasing.

The above information disclosed in this Background section is only for enhancement of understanding of the background and therefore the information discussed in this Background section does not necessarily constitute prior art.

SUMMARY

Aspects of one or more example embodiments include a display device having a relatively reduced dead area, which may be capable of stably transmitting a data signal to a pixel without increasing the manufacturing cost.

Additional aspects will be set forth in part in the description which follows and, in part, will be more apparent from the description, or may be learned by practice of the presented example embodiments of the disclosure.

According to one or more example embodiments, a display device includes: a substrate including a display area and a peripheral area outside the display area; a first connection line including a first portion in the display area and extending along a first column of the display area, a third portion extending along a second column of the display area, and a second portion connecting the first portion to the third portion; and a second connection line in the peripheral area and connected to the third portion of the first connection line and a data line in a third column of the display area.

According to some example embodiments, the first connection line and the second connection line may be on the same layer.

According to some example embodiments, the first connection line and the second connection line may be on different layers.

According to some example embodiments, the data line and the first connection line may be on different layers.

According to some example embodiments, the data line and the second connection line may be on different layers.

According to some example embodiments, the data line and the second connection line may be on different layers.

According to some example embodiments, the display device may further include a third connection line in the peripheral area and connected to a first pad of a pad area located in the peripheral area and the first portion of the first connection line; and a fourth connection line in the peripheral area and connected to a second pad of the pad area and a data line in the first column.

According to some example embodiments, at least one pad may be further between the first pad and the second pad.

According to some example embodiments, the first connection line and the third connection line may be on the same layer.

According to some example embodiments, the data line in the first column and the fourth connection line may be on the same layer.

According to some example embodiments, the display device may further include a pixel electrode on an upper layer of the first connection line.

According to some example embodiments, the second column may be immediately adjacent to the first column.

According to some example embodiments, the second column may be a column spaced from the first column by a plurality of columns.

According to some example embodiments, the third column may be immediately adjacent to the second column.

According to some example embodiments, the third column may be a column spaced from the second column by a plurality of columns.

According to some example embodiments, the display device may further include the third connection line in the peripheral area and connected to a first pad of a pad area located in the peripheral area and the first portion of the first connection line; and the fourth connection line in the peripheral area and connected to a second pad of the pad area and a data line in the fourth column of the display area.

According to one or more example embodiments, a display device includes: a substrate including a display area and a peripheral area outside the display area; a plurality of data lines arranged in the display area; a plurality of first connection lines arranged in the display area; and a plurality of second connection lines arranged in the peripheral area, wherein each of the first connection lines includes a first portion and a third portion extending in a first direction and spaced apart from each other by at least one column and a second portion extending in a second direction different from the first direction and connecting the first portion and the third portion, and each of the second connection lines is connected to a third portion of one of the first connection lines and a data line in a column spaced apart by at least one column from the third portion of one of the first connection lines.

According to some example embodiments, the second connection lines may be on a layer different from the layer where the first connection lines are arranged.

According to some example embodiments, each of the second connection lines may be a portion where each of the first connection lines is turned to the peripheral area and extends.

According to some example embodiments, the display device may further include: a plurality of third connection lines arranged in the peripheral area; and a plurality of fourth connection lines arranged in the peripheral area, wherein each of the third connection lines may be connected to a first pad of a pad area located in the peripheral area and a first portion of one of the first connection lines, and each of the fourth connection lines may be in the peripheral area and connected to a second pad of the pad area and one of the data lines.

Additional aspects will be set forth in part in the description which follows and, in part, will be more apparent from the description, or may be learned by practice of the presented example embodiments.

BRIEF DESCRIPTION OF THE DRAWINGS

The above and other aspects, features, and characteristics of certain example embodiments of the disclosure will be more apparent from the following description taken in conjunction with the accompanying drawings, in which:

FIGS. 21A to 21D are cross-sectional views of a display panel according to some example embodiments; and FIGS. 22A to 22D are cross-sectional views of a display panel according to some example embodiments.

DETAILED DESCRIPTION

Figure 1:
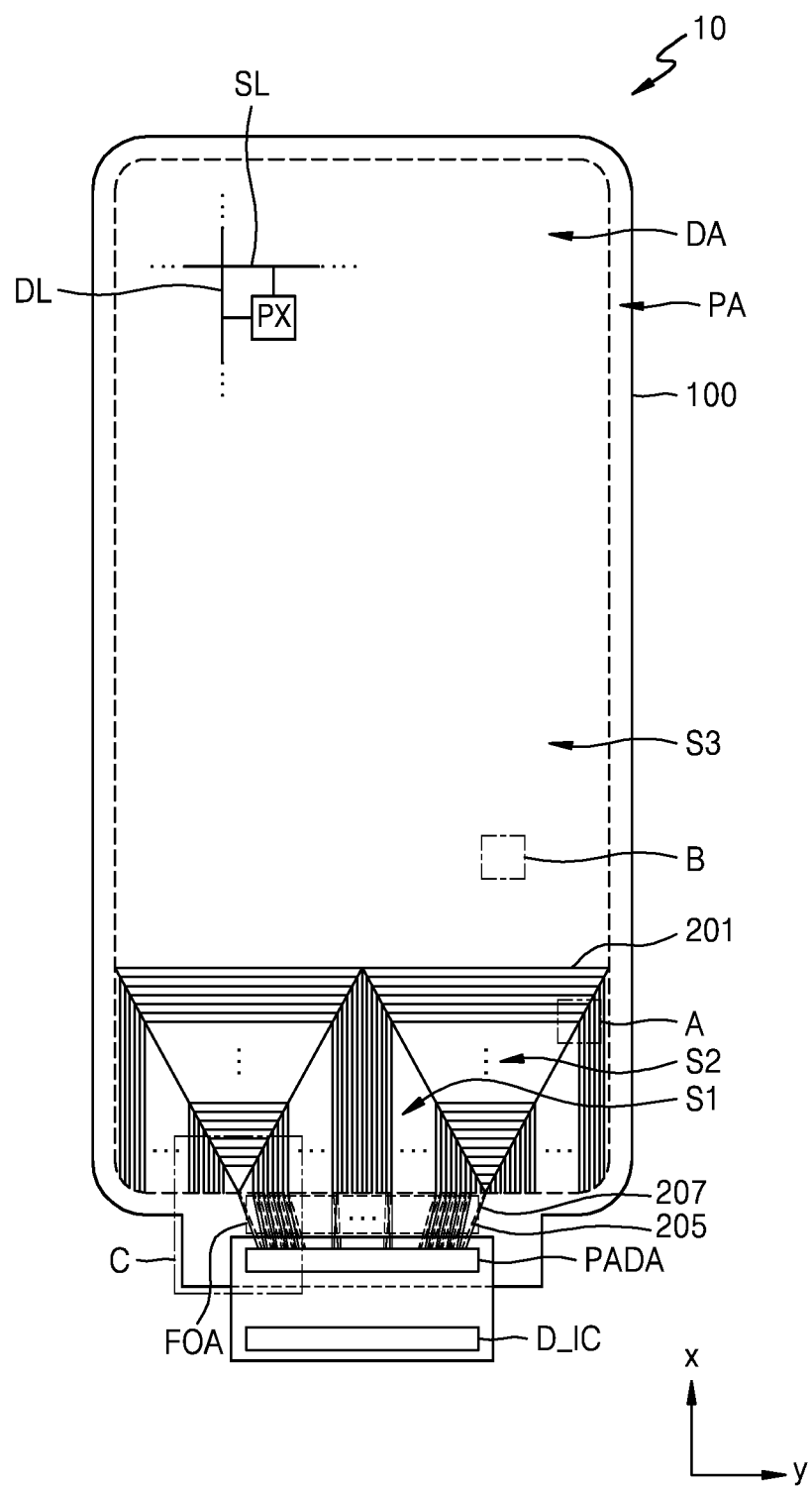
FIG. 1 is a plan view of an example of a display panel according to some example embodiments.

Reference will now be made in more detail to aspects of some embodiments, examples of which are illustrated in the accompanying drawings, wherein like reference numerals refer to like elements throughout. In this regard, the present embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various elements, these elements should not be limited by these terms.

An expression used in the singular encompasses the expression of the plural, unless it has a clearly different meaning in the context.

It will be further understood that the terms "comprises" and/or "comprising" used herein specify the presence of stated features or elements, but do not preclude the presence or addition of one or more other features or elements.

It will be understood that when a layer, region, or element is referred to as being "formed on" another layer, region, or element, it can be directly or indirectly formed on the other layer, region, or element. That is, for example, intervening layers, regions, or elements may be present.

Sizes of elements in the drawings may be exaggerated for convenience of explanation. In other words, because sizes and thicknesses of elements in the drawings are arbitrarily illustrated for convenience of description, the following embodiments are not limited thereto.

Hereinafter, aspects of some example embodiments will be described in more detail with reference to the accompanying drawings. The same reference numerals are used to denote the same elements.

FIG. 1 is a plan view of an example of a display panel 10 according to some example embodiments.

Referring to FIG. 1, the display panel 10 according to an embodiment has a display area DA in which an image is displayed and a peripheral area PA located outside the display area DA. It may be understood that a substrate 100 provided in the display panel 10 has the display area DA and the peripheral area PA.

A plurality of pixels PX and conductive lines capable of applying electrical signals to the plurality of pixels PX may be located in the display area DA.

Each of the plurality of pixels PX may include a display element and a circuit unit for driving the display element. For example, the display element may include an organic light-emitting device, and the circuit unit may include a plurality of transistors, a capacitor, and the like.

The conductive lines that may apply an electrical signal to a plurality of pixels PX may include a plurality of scan lines SL, a plurality of data lines DL, and the like. Each of the plurality of scan lines SL may extend in a y direction, and each of the plurality of data lines DL may extend in an x direction. For example, the plurality of scan lines SL may be arranged in a plurality of rows to transmit a scan signal to the pixels PX, and the plurality of data lines DL may be arranged in a plurality of columns to transmit a data signal to the pixels PX. Each of the plurality of pixels PX may be connected to a corresponding one of the plurality of scan lines SL and a corresponding one of the plurality of data lines DL.

In addition, first connection lines 201 for transmitting an electrical signal supplied from the pad area PADA to the conductive lines connected to the pixels PX are located in the display area DA. For example, the first connection lines 201 may be connected to the data lines DL to transmit a data signal supplied from the pad area PADA to the data lines DL. The first connection lines 201 are connected to the data lines DL by second connection lines 203 to be described in more detail later below with reference to FIG. 8 to transmit the data signal supplied from the pad area PADA to the data lines DL.

The first connection lines 201 extend in a +x direction (first direction) at approximately the center of the display area DA and then are bent and extend in the y direction (second direction) perpendicular to the x direction toward an edge of the display area DA, and may be bent and extend in a −x direction (first direction) again. According to some example embodiments, conductive lines connecting data lines to pads of the pad area PADA are located in the display area DA, thereby reducing the area of the peripheral area PA and enlarging the display area DA to reduce a dead area of a display device.

Figure 6:
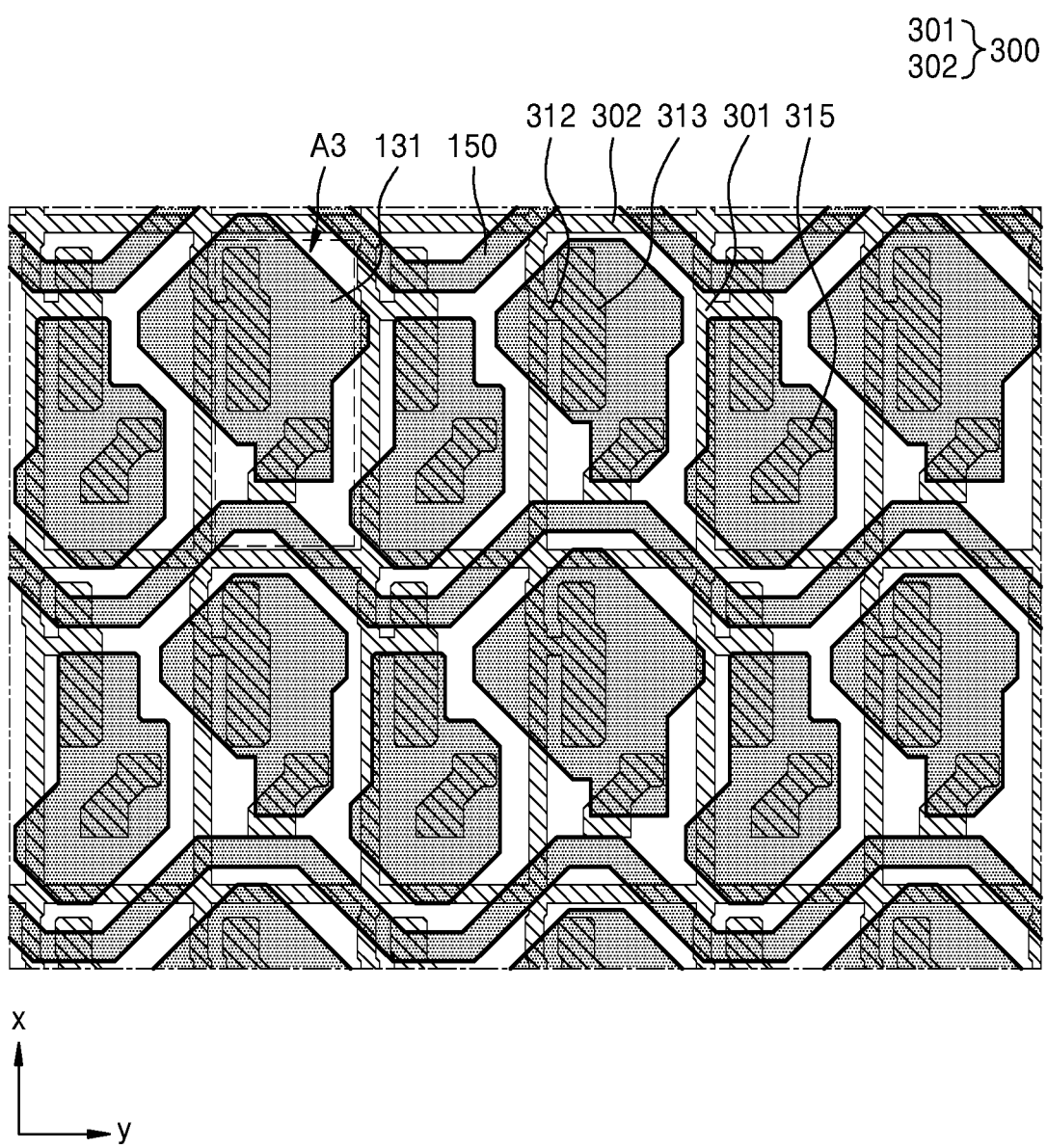
FIG. 6 is a plan view of an example of region B in FIG. 1.

The display area DA may be divided into a plurality of areas in an extension direction of the first connection lines 201. For example, the display area DA may include a first area S1 in which the first connection lines 201 extend in the first direction (+x direction, −x direction), a second area S2 in which the first connection lines 201 extend in the second direction (y direction), and the third area S3 excluding the first area S1 and the second area S2 The third area S3 may be a region in which the first connection lines 201 are not located and first dummy patterns 300 are located as shown in FIG. 6. Each of the first area S1 and the second area S2 may have a plurality of triangular shapes. In more detail, a shape of the central first area S1 may be a triangle. Shapes of the second areas S2 at both sides of the central first areas S1 may be inverted triangles, respectively. The first areas S1 located outside the second areas S2 may have a triangular shape.

The peripheral area PA may surround the display area DA. The peripheral area PA, which is an area where the pixels PX are not located, may include the pad area PADA, which is an area to which various electronic devices or printed circuit boards are electrically attached, and a voltage line or the like for supplying power for driving a display device may be located therein. The plurality of pads of the pad area PADA may be electrically connected to a film on which a data driver D_IC is arranged. FIG. 1 shows a chip on film (COF) method in which the data driver D_IC is arranged on a film electrically connected to pads on the substrate 100. According to some example embodiments, the data driver D_IC may be directly positioned on the substrate 100 by using a chip on glass (COG) or chip on plastic (COP) method.

The display panel 10 may have a fan-out area FOA in the peripheral area PA. The fan-out area FOA may be an area between the pad area PADA and the display area DA. Third connection lines 205 and fourth connection lines 207 may be arranged in the fan-out area FOA. The third connection lines 205 may be connected to the first connection lines 201 to transmit the data signal supplied from the pad area PADA to the first connection lines 201. The fourth connection lines 207 may be connected to the data lines DL to transmit the data signal supplied from the pad area PADA to the data lines DL. The second connection lines 203 may be arranged in the peripheral area PA.

FIG. 1 may be a plan view showing a state of the substrate 100 and the like during a manufacturing process of a display device. In a final display device or an electronic device such as a smartphone including a display device, a portion of the substrate 100 may be bent in order to minimize or reduce the area of the peripheral area PA recognized by a user.

Figure 2A:
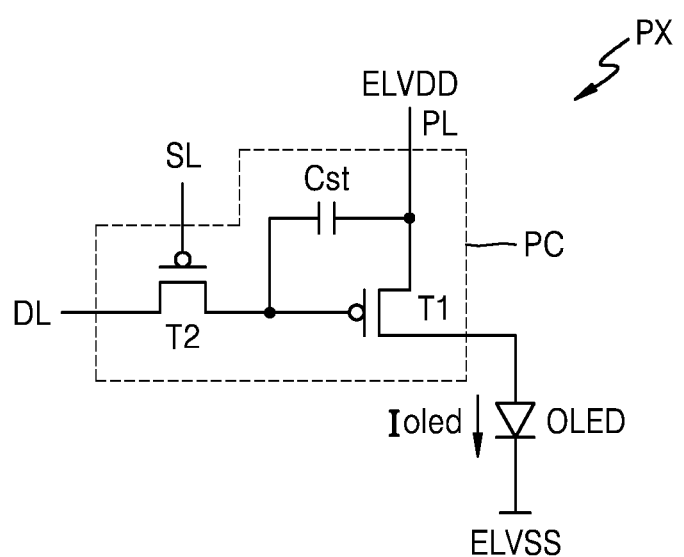
FIGS. 2A and 2B are equivalent circuit diagrams of a pixel in a display panel according to some example embodiments.
Figure 2B:
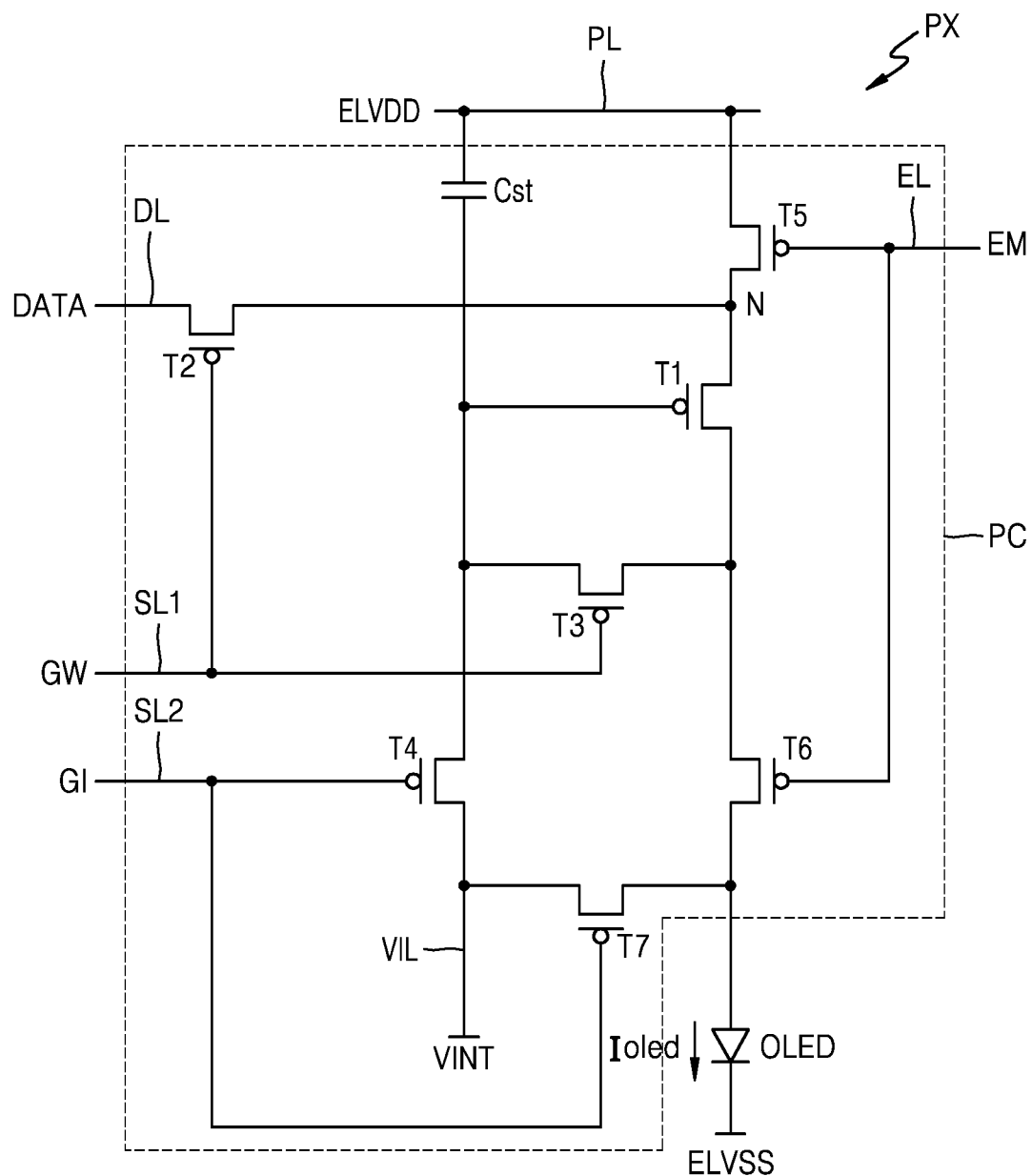

FIGS. 2A and 2B are equivalent circuit diagrams of a pixel in a display panel according to some example embodiments.

Referring to FIG. 2A, a pixel PX includes a pixel circuit PC and an organic light-emitting diode OLED as a display element connected to the pixel circuit PC. The pixel circuit PC may include a first transistor T1, a second transistor T2, and a capacitor Cst. Each pixel PX may emit, for example, red, green, blue, or white light from the organic light-emitting diode OLED. The first transistor T1 and the second transistor T2 may be thin-film transistors.

The second transistor T2, which is a switching transistor, is connected to a scan line SL and a data line DL and may transmit the data signal input to the data line DL to the first transistor T1 according to a switching voltage input to the scan line SL. The capacitor Cst is connected to the second transistor T2 and the power supply voltage line PL and may store a voltage corresponding to a difference between a voltage corresponding to the data signal received from the second transistor T2 and a first power supply voltage ELVDD supplied to the power supply voltage line PL. The power supply voltage line PL may be apart from and parallel to the scan line SL or the data line DL.

The first transistor T1 is a driving transistor which is connected to the power supply voltage line PL and the storage capacitor Cst and may control a driving current flowing to the organic light-emitting diode OLED from the power supply voltage line PL corresponding to a voltage value stored in the storage capacitor Cst. The organic light-emitting diode OLED may emit light having certain luminance according to a driving current Ioled. An opposite electrode (e.g., cathode) of the organic light-emitting diode OLED may be supplied with a second power supply voltage ELVSS.

FIG. 2A shows that the pixel circuit PC includes two transistors and one capacitor, but the disclosure is not limited thereto. The number of transistors and the number of capacitors may vary according to the design of the pixel circuit PC.

FIG. 2B shows that signal lines SL1, SL2, EL, and DL, an initialization voltage line VIL, and the power supply voltage line PL are provided for each pixel PX. However, the disclosure is not limited thereto. According to some example embodiments, at least one of the signal lines SL1, SL2, EL, and DL, the initialization voltage line VIL, and/or the power supply voltage line PL may be shared by neighboring pixels.

The signal lines include a first scan line SL1 for transmitting a first scan signal GW, a second scan line SL2 for transmitting a second scan signal GI, an emission control line EL for transmitting an emission control signal EM, and the data line DL which intersects with the first scan line SL1 and transmits a data signal DATA. The second scan line SL2 may be connected to the first scan line SL1 of the next row or the previous row, and the second scan signal GI may be the first scan signal GW of the next row or the previous row.

The power supply voltage line PL transmits the first power supply voltage ELVDD to the first transistor T1, and the initialization voltage line VIL transmits an initialization voltage VINT for initializing the first transistor T1 and a pixel electrode of the organic light-emitting diode OLED.

The first scan line SL1, the second scan line SL2, the emission control line EL, and the initialization voltage line VIL may extend in the y direction and may be spaced apart from each other in each row. The data line DL and the power supply voltage line PL may extend in the x direction and may be spaced apart from each other in each column.

The pixel circuit PC of the pixel PX may include a plurality of first to seventh transistors T1 to T7 and the capacitor Cst. The first to seventh transistors T1 to T7 may be thin-film transistors.

The first transistor T1 is connected to the power supply voltage line PL via the fifth transistor T5 and is electrically connected to the pixel electrode of the organic light-emitting diode OLED via the sixth transistor T6. The first transistor T1 serves as a driving transistor and receives the data signal DATA according to a switching operation of the second transistor T2 to supply the driving current Ioled to the organic light-emitting diode OLED.

The second transistor T2 is connected to the first scan line SL1 and the data line DL and is turned on in response to the first scan signal GW received through the first scan line SL1 to perform a switching operation for transmitting the data signal DATA transmitted to the data line DL to a node N.

The third transistor T3 is connected to the pixel electrode of the organic light-emitting diode OLED via the sixth transistor T6. The third transistor T3 is turned on in response to the first scan signal GW received through the first scan line SL1 to diode-connect the first transistor T1.

The fourth transistor T4 is turned on in response to the second scan signal GI received through the second scan line SL2 to transmit the initialization voltage VINT from the initialization voltage line VIL to a gate electrode of the first transistor T1, thereby initializing the gate voltage of the first transistor T1.

The fifth transistor T5 and the sixth transistor T6 are simultaneously turned on in response to the emission control signal EM received through the emission control line EL to form a current path so that the driving current Ioled may flow from the power supply voltage line PL to the organic light-emitting diode OLED.

The seventh transistor T7 is turned on in response to the second scan signal GI received through the second scan line SL2 to transmit the initialization voltage VINT from the initialization voltage line VIL to the pixel electrode of the organic light-emitting diode OLED, thereby initializing the pixel electrode of the organic light-emitting diode OLED. The seventh transistor T7 may be omitted.

Although the fourth transistor T4 and the seventh transistor T7 are connected to the second scan line SL2 in FIG. 2B, the disclosure is not limited thereto. According to some example embodiments, the fourth transistor T4 may be connected to the second scan line SL2 and the seventh transistor T7 may be connected to a separate conductive line to be driven according to a signal transmitted to the conductive line.

The capacitor Cst is connected to the power supply voltage line PL and the gate electrode of the first transistor T1 and may maintain a voltage applied to the gate electrode of the first transistor T1 by storing and maintaining a voltage corresponding to the difference between voltages at both ends thereof.

The organic light-emitting diode OLED includes the pixel electrode and a common electrode facing the pixel electrode, and the common electrode thereof may receive the second power supply voltage ELVSS. The organic light-emitting diode OLED receives the driving current Ioled from the first transistor T1 and emits light to display an image.

Figure 3:
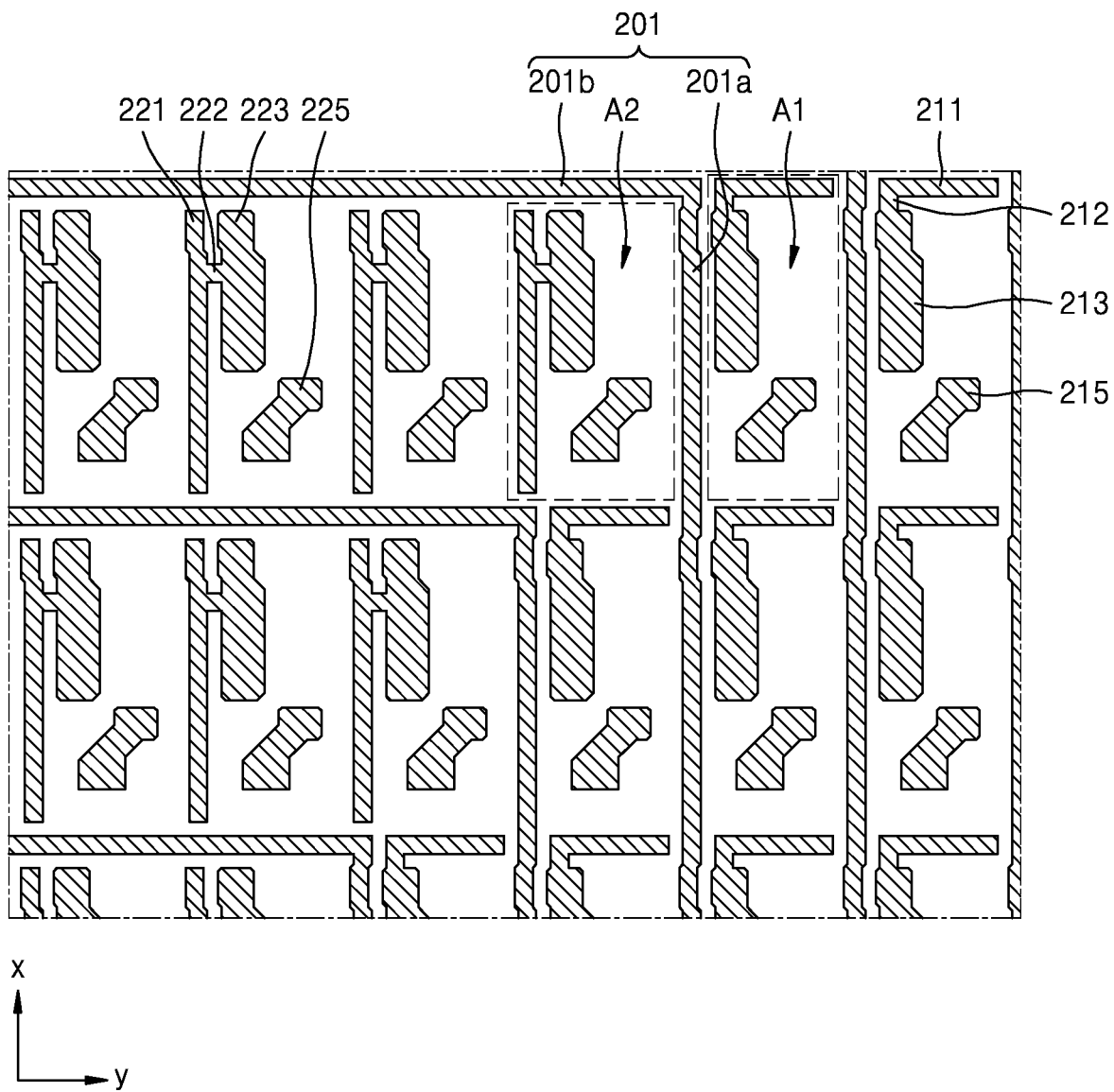
FIGS. 3 and 4 are plan views of an example of region A in FIG. 1.
Figure 4:
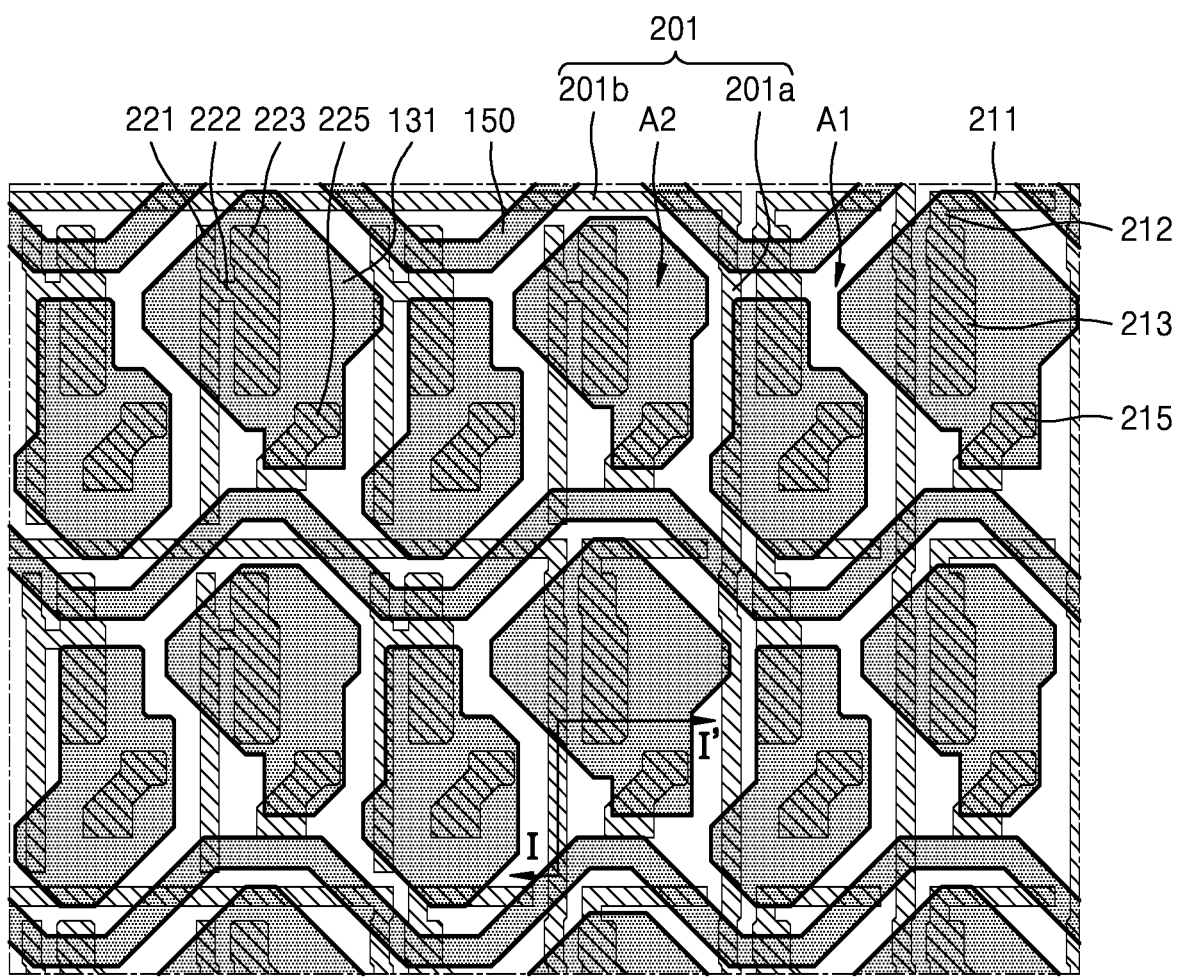
Figure 5:
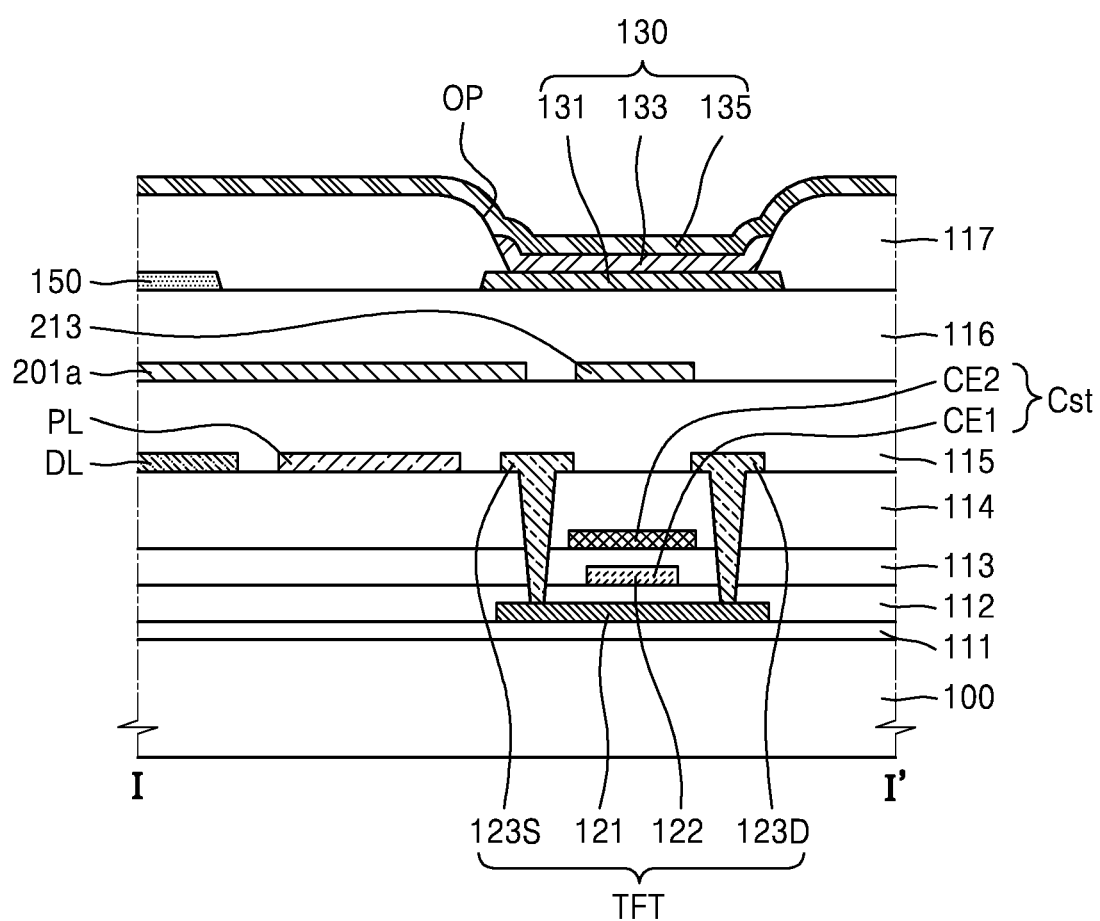
FIG. 5 is a cross-sectional view taken along the line I-I' of FIG. 4.

FIGS. 3 and 4 are plan views schematically illustrating an example of region A of FIG. 1. FIG. 5 is a cross-sectional view taken along line I-I' of FIG. 4.

Referring to FIG. 3, each of the first connection lines 201 may include a first portion 201a extending in the +x direction in the first area S1, a second portion 201b extending in the y direction (−y or +y direction) from the first portion 201a in the second area S2, and a third portion 201c (of FIG. 8) which is bent and extends in the −x direction from the second portion 201b in the first area S1.

The first portion 201a of a first connection line 201 may extend and be located in one of a plurality of columns. The third portion 201c of the first connection line 201 may extend and be located in a column spaced apart by at least one column from a column in which the first portion 201a is located.

First pattern areas A1 partitioned between first portions 201a of the adjacent first connection lines 201 may be located in the first area S1. A first dummy pattern 211, a second dummy pattern 213, and a third dummy pattern 215 may be arranged in a first pattern area A1. The first dummy pattern 211 and the second portion 201b of the first connection line 201 may be on an imaginary straight line in a direction in which the second portion 201b extends. The first dummy pattern 211 and the second dummy pattern 213 may be connected to each other by a branch 212 protruding from the first dummy pattern 211. The branch 212 is a portion of the first dummy pattern 211 and may be a dummy pattern. The first dummy pattern 211, the branch 212, and the second dummy pattern 213 may be integrally formed. Likewise, first pattern areas A1 partitioned between the third portions 201c of the adjacent first connection lines 201 may be located in the first area S1.

Second pattern areas A2 partitioned between second portions 201b of the adjacent first connection lines 201 may be located in the second area S2. A first dummy pattern 221, a second dummy pattern 223, and a third dummy pattern 225 may be arranged in a second pattern area A2. The first dummy pattern 221 and the first portion 201a of the first connection line 201 may be on an imaginary straight line in a direction in which the first portion 201a extends. Likewise, the first dummy pattern 221 and the third portion 201c of the first connection line 201 may be on an imaginary straight line in a direction in which the third portion 201c extends. The first dummy pattern 221 and the second dummy pattern 223 may be connected to each other by a branch 222 protruding from the first dummy pattern 221 in a second direction. The branch 222 is a portion of the first dummy pattern 221 and may be a dummy pattern. The first dummy pattern 221, the branch 222, and the second dummy pattern 223 may be integrally formed.

The first connection line 201, the first dummy pattern 211, the second dummy pattern 213, and the third dummy pattern 215 of the first pattern area A1, and the branch 212, the first dummy pattern 221, the second dummy pattern 223, and the third dummy pattern 225 of the second pattern area A2, and the branch 222 may be arranged on the same layer. The shapes of the second dummy pattern 213 and the third dummy pattern 215 of the first pattern area A1 are similar to the shapes of the second dummy pattern 223 and the third dummy pattern 225 of the second pattern area A2, respectively.

Because reflection characteristics of light are similar in the first area S1 and the second area S2 by the first pattern areas A1 and the second pattern areas A2, that the first area S1 and the second area S2 are partitioned and recognized according to an incidence angle of light may be prevented, or minimized, or reduced.

A display element may be on the first connection line 201. Hereinafter, FIGS. 4 and 5 will be described in more detail.

The display panel 10 includes the substrate 100. The substrate 100 may include a variety of flexible or bendable materials, for example, a polymer resin such as polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP). In addition, the substrate 100 may have a multilayer structure including two layers including the polymer resin, and a barrier layer including an inorganic material (such as silicon oxide, silicon nitride, silicon oxynitride, etc.) between the two layers, and various modifications thereof may be made.

A plurality of pixels PX may be arranged in the display area DA of the substrate 100. Each pixel PX may have a display element 130 electrically connected to a thin-film transistor TFT, a capacitor Cst, and a thin-film transistor TFT. The display element 130 may be the organic light-emitting diode OLED of FIGS. 2A and 2B. The thin-film transistor TFT may be one of the transistors of FIGS. 2A and 2B. For example, the thin-film transistor TFT illustrated in FIG. 5 may be the first transistor T1 of FIGS. 2A and 2B.

A buffer layer 111 may be on the substrate 100 if necessary. The buffer layer 111 may planarize a surface of the substrate 100 or prevent impurities or the like from penetrating into a semiconductor layer thereon. The buffer layer 111 may have a single layer/multilayer structure including an inorganic insulating material such as silicon oxide, silicon nitride, or silicon oxynitride. The buffer layer 111 may be omitted.

The thin-film transistor TFT may be on the buffer layer 111. The thin-film transistor TFT may include a semiconductor layer 121, a gate electrode 122, a source electrode 123S, and a drain electrode 123D.

The semiconductor layer 121 may include amorphous silicon, polycrystalline silicon, or an organic semiconductor material. The semiconductor layer 121 may include a source region, a drain region, and a channel region between the source region and the drain region.

The gate electrode 122 may be formed of a material such as aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) considering adhesion with an adjacent layer, surface flatness of a layer to be stacked, and workability.

A first insulating layer 112 may be between the semiconductor layer 121 and the gate electrode 122. A second insulating layer 113 and a third insulating layer 114 may be arranged between the gate electrode 122, and the source electrode 123S and the drain electrode 123D. The first insulating layer 112, the second insulating layer 113, and the third insulating layer 114 may include an inorganic material such as silicon oxide, silicon nitride, and/or silicon oxynitride. According to some example embodiments, the scan lines SL, SL1, and SL2 and the emission control line EL of FIGS. 2A and 2B may be on the same layer as that of the gate electrode 122, that is, on the first insulating layer 112.

The source electrode 123S and the drain electrode 123D may be electrically connected to the source region and the drain region of the semiconductor layer 121 through contact holes formed in the first insulating layer 112, the second insulating layer 113, and the third insulating layer 114, respectively.

The source electrode 123S and the drain electrode 123D may include at least one of materials selected from Al, Pt, Pd, Ag, Mg, Au, Ni, Nd, Ir, Cr, Li, Ca, Mo, Ti, W, and Cu, and may be a single layer or multiple layers.

The capacitor Cst includes a lower electrode CE1 and an upper electrode CE2 which overlap each other with the second insulating layer 113 therebetween. The capacitor Cst may overlap the thin-film transistor TFT. In this regard, FIG. 5 shows that the gate electrode 122 of the thin-film transistor TFT is the lower electrode CE1 of the capacitor Cst.

According to some example embodiments, the capacitor Cst may not overlap the thin-film transistor TFT, and the lower electrode CE1 of the capacitor Cst may be an independent element separate from the gate electrode 122 of the thin-film transistor TFT. The capacitor Cst may be covered with the third insulating layer 114. According to some example embodiments, the initialization voltage line VIL of FIG. 2B may be on the same layer as that of the upper electrode CE2 of the capacitor Cst, that is, on the second insulating layer 113.

A pixel circuit including the thin-film transistor TFT and the capacitor Cst may be covered with a fourth insulating layer 115 and a fifth insulating layer 116. The fourth insulating layer 115 and the fifth insulating layer 116 may be an organic insulating layer as a planarization insulating layer. The fourth insulating layer 115 and the fifth insulating layer 116 may include an organic insulation material such as a general commercial polymer such as polymethyl methacrylate (PMMA) or polystyrene (PS), a polymer derivative including a phenolic group, an acrylic polymer, an imide polymer, an aryl ether polymer, an amide polymer, a fluorine-based polymer, a p-xylene-based polymer, a vinyl alcohol polymer, and a blend thereof. According to some example embodiments, the fourth insulating layer 115 and the fifth insulating layer 116 may include polyimide.

Meanwhile, various conductive layers may be further arranged on the third insulating layer 114. For example, the data line DL and the power supply voltage line PL may be on the third insulating layer 114, that is, the same layer as that of the source electrode 123S and the drain electrode 123D. The data line DL and the power supply voltage line PL may include the same material as those the source electrode 123S and the drain electrode 123D. The data line DL and the power supply voltage line PL may include a conductive material including Mo, Al, Cu, Ti, or the like, and may be formed as a single layer or multiple layers including the above-described materials. For example, the data line DL and the power supply voltage line PL may have a multilayer structure of Ti/Al/Ti.

The fourth insulating layer 115 may be on the data line DL and the power supply voltage line PL. As illustrated in FIG. 4, the first connection line 201 and the dummy patterns 211, 212, 213, 215, 221, 222, 223, and 225 may be on the fourth insulating layer 115. The first connection line 201 and the dummy patterns 211, 212, 213, 215, 221, 222, 223, and 225 may be a single layer or multiple layers including at least one of Al, Cu, Ti, and an alloy thereof. For example, the first connection line 201 and the dummy patterns 211, 212, 213, 215, 221, 222, 223, and 225 may have a multilayer structure of Ti/Al/Ti.

The fifth insulating layer 116 may be on the first connection line 201 and the dummy patterns 211, 212, 213, 215, 221, 222, 223, and 225. According to some example embodiments, at least a portion of the first portion 201a and the third portion 201c of the first connection line 201 may overlap the data line DL or the power supply voltage line PL. At least a portion of the second portion 201b of the first connection line 201 may overlap one of the scan line SL, the emission control line EL, and the initialization voltage line VIL.

The display element 130 may be on the fifth insulating layer 116. The display element 130 may include a pixel electrode 131, an opposite electrode 135, and an intermediate layer 133 between the pixel electrode 131 and the opposite electrode 135.

The pixel electrode 131 may include a conductive oxide such as indium tin oxide (ITO), indium zinc oxide (IZO), zinc oxide (ZnO), indium oxide (In2O3), indium gallium oxide (IGO), or aluminum zinc oxide (AZO). According to some example embodiments, the pixel electrode 131 may include a reflective layer including Ag, Mg, Al, Pt, Pd, Au, Ni, Nd, Ir, Cr, or a compound thereof. According to some example embodiments, the pixel electrode 131 may further include a film formed of ITO, IZO, ZnO, or $In_2O_3$ above/below the reflective layer.

A shielding member 150 may be further above the fifth insulating layer 116. The shielding member 150 extends in the y direction along a portion of the edge of the pixel electrode 131 so as not to overlap the pixel electrode 131 in a plan view, and may be located above portion or below portion each row. The shielding member 150 may have a straight line shape or a zigzag shape extending in the second direction according to the arrangement of the pixel electrodes 131 in the same row. The shielding member 150 may include a light-shielding metal. For example, the shielding member 150 may include Mo, Al, Cu, Ti, or the like, and may be a single layer or multiple layers including the above-described materials. According to some example embodiments, the shielding member 150 may have a multilayer structure of Ti/Al/Ti. The shielding member 150 may include the same material as that of the pixel electrode 131. Shielding members 150 are spaced apart from each other and may be provided independently for each row. The shielding members 150 may be floated or electrically connected to a constant voltage line (e.g., a power supply voltage line, an initialization voltage line, etc.) to receive a constant voltage.

A sixth insulating layer 117 covering the edge of the pixel electrode 131 may be on the fifth insulating layer 116. The sixth insulating layer 117 may define a pixel by having an opening OP exposing a portion of the pixel electrode 131. The sixth insulating layer 117 may include an organic material such as acryl, benzocyclobutene (BCB), polyimide, or hexamethyldisiloxane (HMDSO). Alternatively, the sixth insulating layer 117 may include the above-described inorganic material.

The intermediate layer 133 may be formed on the pixel electrode 131 exposed by the opening OP of the sixth insulating layer 117. The intermediate layer 133 includes a light-emitting layer. The light-emitting layer may include a polymer or a low-molecular weight organic material that emits light of a certain color. The light-emitting layer may be a red light-emitting layer, a green light-emitting layer, or a blue light-emitting layer. Alternatively, the light-emitting layer may have a multilayer structure in which a red light-emitting layer, a green light-emitting layer, and a blue light-emitting layer are stacked or may have a single layer structure including a red light-emitting material, a green light-emitting material, and a blue light-emitting material so as to emit white light. According to some example embodiments, the intermediate layer 133 may include a first functional layer under the light emitting layer and/or a second functional layer over the light emitting layer. The first functional layer and/or second functional layer may include an integral layer over all the pixel electrodes 131 or may have a layer patterned to correspond to each of the pixel electrodes 131.

The first functional layer may be a single layer or multiple layers. For example, when the first functional layer includes a polymer material, the first functional layer may be a hole transport layer (HTL) having a single-layer structure and may include poly-(3,4-ethylenedioxythiophene) (PEDOT) or polyaniline (PANI). When the first functional layer is formed of a low molecular weight material, the first functional layer may include a hole injection layer (HIL) and a hole transport layer (HTL).

The second functional layer may be omitted. For example, when the first functional layer and the light emitting layer are formed of a polymer material, the second functional layer may be formed in order to improve characteristics of an organic light-emitting diode. The second functional layer may be a single layer or multiple layers. The second functional layer may include an electron transport layer (ETL) and/or an electron injection layer (EIL).

The opposite electrode 135 is arranged to face the pixel electrode 131 with the intermediate layer 133 therebetween. The opposite electrode 135 may include a conductive material having a low work function. For example, the opposite electrode 135 may include a (semi) transparent electrode including Ag, Mg, Al, Pt, Pd, Au, Ni, Nd, Ir, Cr, or an alloy thereof. Alternatively, the opposite electrode 135 may further include a layer such as ITO, IZO, ZnO, or $In_2O_3$ on the (semi) transparent layer including the above-mentioned material.

FIG. 6 is a plan view of an example of region B in FIG. 1.

Referring to FIG. 6, a first dummy pattern 300 may be located in the third area S3. The first dummy pattern 300 may include a plurality of first portions 301 extending in the x direction and spaced apart from each other and a plurality of second portions 302 extending in the y direction to cross the first portions 301 and spaced apart from each other. The first dummy pattern 300 may have a lattice structure in which the plurality of first portions 301 and the plurality of second portions 302 are connected to each other. Third pattern areas A3 may be partitioned by the first dummy pattern 300 in the third area S3. A branch 312 that is protruding from the first portions 301, a second dummy pattern 313, and a third dummy pattern 315 may be arranged in a third pattern area A3. The second dummy pattern 313 may be connected to the first dummy pattern 300 by the branch 312. The branch 312 is a portion of the first dummy pattern 300 and may be a dummy pattern. The first dummy pattern 300, the branch 312, and the second dummy pattern 313 may be integrally formed.

The first dummy pattern 300, the second dummy pattern 313, the third dummy pattern 315, and the branch 312 may be arranged on the same layer. The first dummy pattern 300 may be on the same layer as that of the first connection line 201. The first dummy pattern 300 may include the same material as that of the first connection line 201.

The fifth insulating layer 116 (of FIG. 5) is on the first dummy pattern 300, the second dummy pattern 313, the third dummy pattern 315, and the branch 312, and the display element 130 and the shielding member 150 may be on the fifth insulating layer 116.

Figure 7:
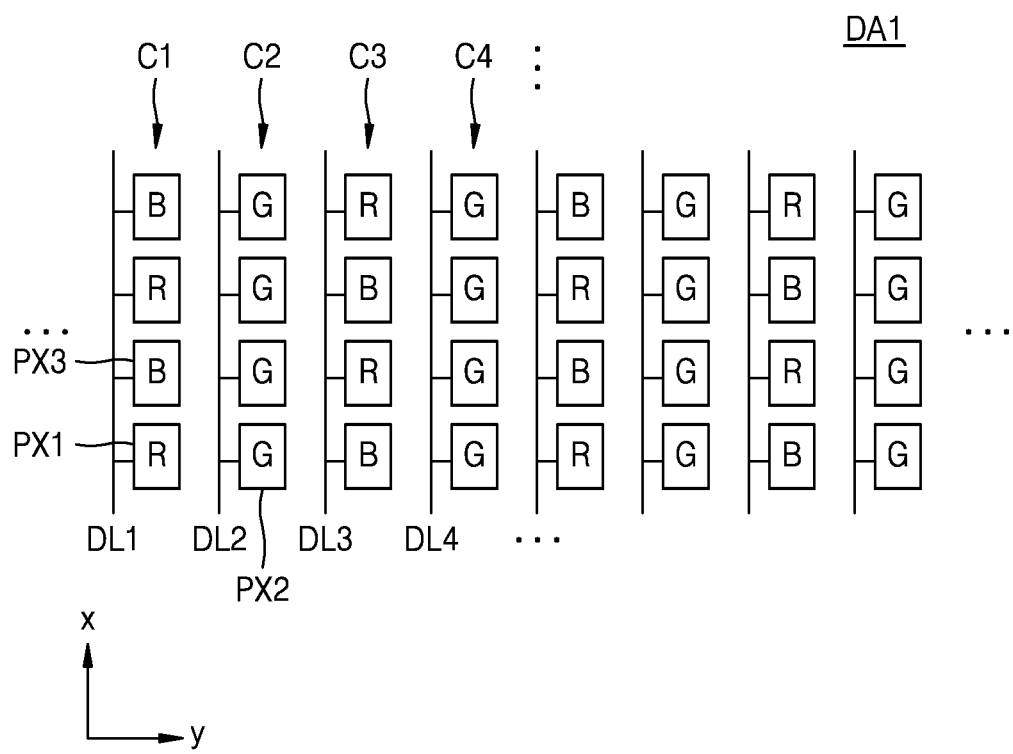
FIG. 7 is a view of a pixel array according to some example embodiments.

FIG. 7 is a view of a pixel array according to some example embodiments.

Referring to FIG. 7, in a display area DA1, the plurality of pixels PX may be arranged along a column in the x direction and a row in the y direction. The pixels PX may include a plurality of first pixels PX1 displaying a first color, a plurality of second pixels PX2 displaying a second color, and a plurality of third pixels PX3 displaying a third color. According to some example embodiments, a first pixel PX1 may be a red pixel R, a second pixel PX2 may be a green pixel G, and a third pixel PX3 may be a blue pixel B.

The first pixel PX1 and the third pixel PX3 may be alternately arranged in the x direction in a first column C1 and electrically connected to a first data line DL1. The second pixel PX2 may be repeatedly arranged in a second column C2 adjacent to the first column C1 and electrically connected to a second data line DL2. In a third column C3 adjacent to the second column C2, the first pixel PX1 and the third pixel PX3 may be alternately arranged in the x direction and electrically connected to a third data line DL3. The arrangement of the first pixel PX1 and the third pixel PX3 in the third column C3 may be opposite to the arrangement of the first pixel PX1 and the third pixel PX3 in the first column C1. The second pixel PX2 may be repeatedly arranged in a fourth column C4 adjacent to the third column C3 and electrically connected to a fourth data line DL4. The first to fourth columns C1 to C4 may be repeated in the y direction.

Figure 8:
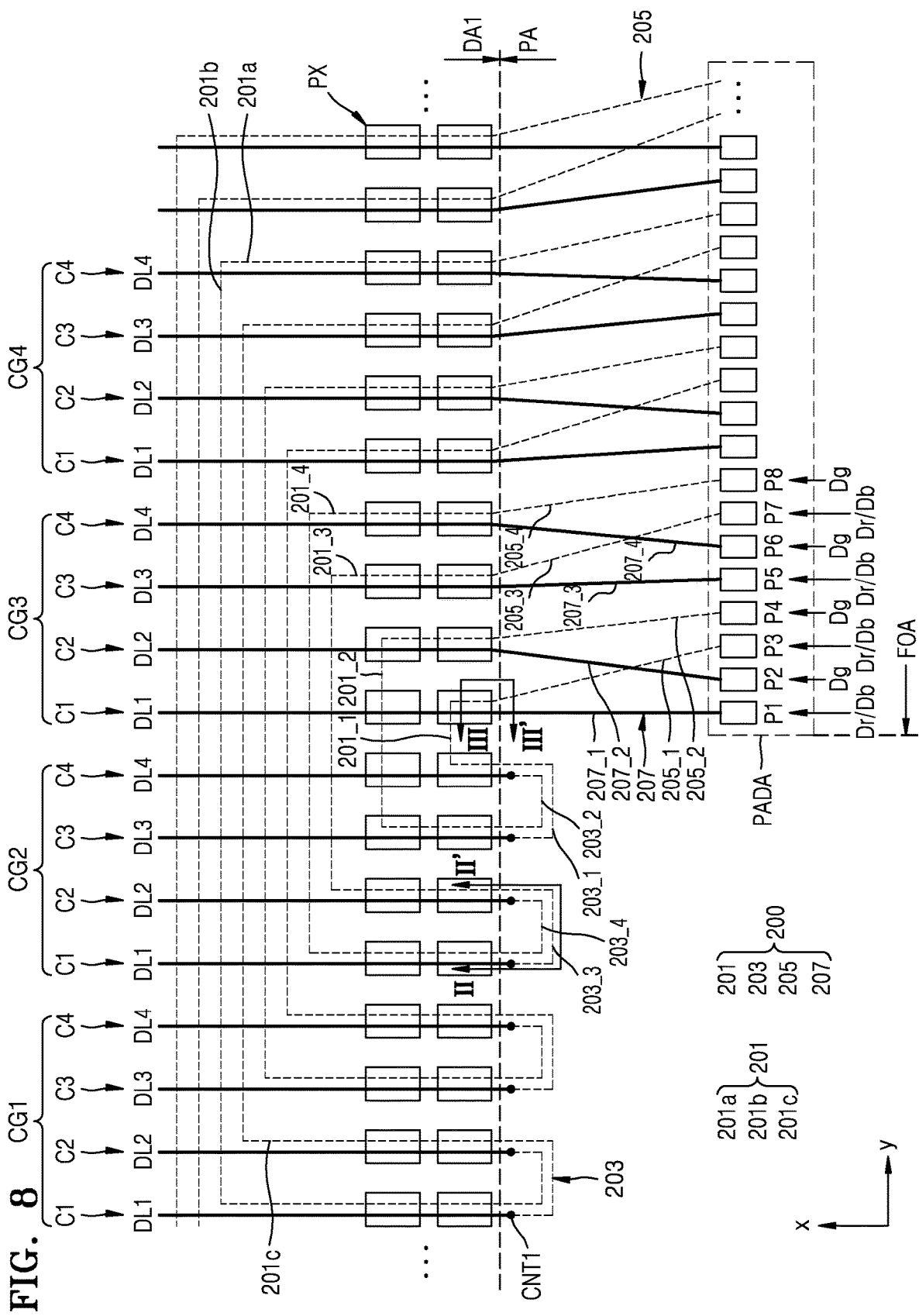
FIG. 8 is a plan view of an example of region C in FIG. 1 to which the pixel array of FIG. 7 is applied.
Figure 9A:
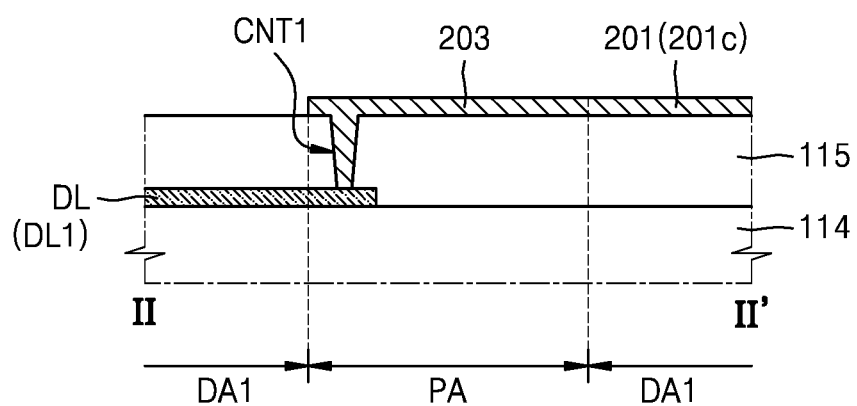
FIG. 9A is a cross-sectional view taken along line II-II' of FIG. 8.
Figure 9B:
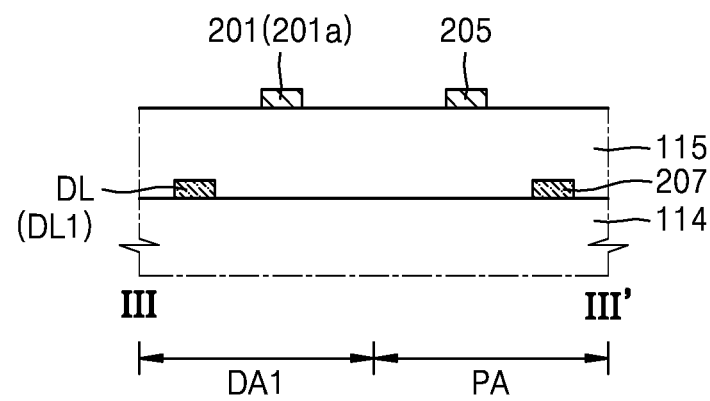
FIG. 9B is a cross-sectional view taken along the line III-III' of FIG. 8.

FIG. 8 is a plan view of an example of region C in FIG. 1 to which the pixel array of FIG. 7 is applied. FIG. 9A is a cross-sectional view taken along line II-II' of FIG. 8, and FIG. 9B is a cross-sectional view taken along line III-III' of FIG. 8.

Referring to FIG. 8, in the display area DA1, the first data line DL1 may be located in each of first columns C1, the second data line DL2 may be located in each of second columns C2, the third data line DL3 may be located in each of third columns C3, and the fourth data line DL4 may be located in each of fourth columns C4. The first to fourth data lines DL1 to DL4 may be repeated in the y direction.

A plurality of connection lines 200 may include the plurality of first connection lines 201 and the plurality of second connection lines 203. The first connection lines 201 may be arranged in the display area DA1, and the second connection lines 203 may be arranged in the peripheral area PA.

Each of the first connection lines 201 may include the first portion 201a extending in the +x direction, the second portion 201b extending in the y direction, and the third portion 201c extending in the -x direction. The second portion 201b may connect the first portion 201a and the third portion 201c with each other. Each of the first portion 201a and the third portion 201c is located in one of the first to fourth columns C1 to C4 to be parallel to one of the first to fourth data lines DL1 to DL4. The column in which the first portion 201a is located and the column in which the third portion 201c is located may be spaced apart by at least one column. For example, in a first connection line 201_1 of the first connection lines 201, the column in which the first portion 201a is located may be a column immediately adjacent to the column in which the first portion 201a is located. In the first connection lines 201 other than the first connection line 201_1 of the first connection lines 201, a column in which the third portion 201c is located may be a column spaced apart by a plurality of column s from a column in which the first portion 201a is located.

The second connection lines 203 may be arranged in the peripheral area PA other than the fan-out area FOA. A second connection line 203 may be a portion in which the third portion 201c of the first connection line 201 extends in a direction changed to a first contact portion CNT1 from the boundary between the display area DA1 and the peripheral area PA. In this case, the second connection line 203 may be integrally formed with the first connection line 201. The second connection line 203 may be connected to the data line DL at the first contact portion CNT1 located in the peripheral area PA. The second connection line 203 may be connected to a data line arranged in a column different from a column in which the third portion 201c of the first connection line 201 is located. A column in which a data line connected to the second connection line 203 is located and a column in which the third portion 201c of the first connection line 201 connected to the second connection line 203 is located may be spaced apart by at least one column. For example, the column in which the data line connected to the second connection line 203 is located may be a column immediately adjacent to the column in which the third portion 201c of the first connection line 201 connected to the second connection line 203 is located. Two second connection lines 203 may be spaced apart from each other between two adjacent columns.

The first connection lines 201 do not cross each other in the display area DA1 by the second connection lines 203, and the first connection lines 201 may transmit first to third data signals Dr, Dg, and Db to the first to fourth data lines DL1 to DL4 in accordance with a sequence of the first to third data signals Dr, Dg, and Db regularly output by the data driver D_IC.

The plurality of connection lines 200 may further include the plurality of third connection lines 205 and the plurality of fourth connection lines 207. The third connection lines 205 and the fourth connection lines 207 may be arranged in the peripheral area PA. The third connection lines 205 and the fourth connection lines 207 may be arranged in the fan-out area FOA.

Each of the third connection lines 205 may be connected to one of a plurality of pads arranged in the pad area PADA and one end of one of the first connection lines 201 (that is, the first portion 201a). According to some example embodiments, a third connection line 205 may be integrally formed with the first connection line 201. According to some example embodiments, the third connection line 205 may be formed separately from the first connection line 201 to be electrically connected to the first connection line 201 by contacting the third connection line 205 of the same layer. According to some example embodiments, the third connection line 205 may be connected to the first portion 201a of the first connection line 201 located on another layer with third connection line 205 through a contact hole penetrating an insulating layer between the first connection line 201 and third connection line 205.

Each of the fourth connection lines 207 may be connected to one of the plurality of pads arranged in the pad area PADA and one of the plurality of data lines DL. A fourth connection line 207 may be on the same layer as that of the data line DL. According to some example embodiments, the fourth connection line 207 may be integrally formed with the data line DL. According to some example embodiments, the fourth connection line 207 may be formed separately from the data line DL to be electrically connected to the data line DL by contacting the data line DL of the same layer. According to some example embodiments, the fourth connection line 207 may be connected to the data line DL located on another layer with the fourth connection line 207 through a contact hole penetrating an insulating layer between the data line DL and the fourth connection line 207. The third connection line 205 and the fourth connection line 207 may be on different layers with the insulating layer therebetween.

FIG. 9A is a cross-sectional view illustrating a positional relationship between the data line DL, the first connection line 201, and the second connection line 203, and FIG. 9B is a cross-sectional view illustrating a positional relationship between the data line DL, the first connection line 201, the third connection line 205, and the fourth connection line 207.

As shown in FIG. 9A, the data line DL may be located on the third insulating layer 114, and the second connection line 203 may be located on the fourth insulating layer 115. The second connection line 203 may be electrically connected to the data line DL through a contact hole of the fourth insulating layer 115 in the first contact portion CNT1. The second connection line 203 may be connected to the third portion 201c of the first connection line 201. The first portion 201a and the third portion 201c of the first connection line 201 may at least partially overlap the data line DL or may not overlap the data line DL.

As shown in FIG. 9B, the fourth connection line 207 may be located on the third insulating layer 114, and the third connection line 205 may be located on the fourth insulating layer 115. In FIG. 9B, the first portion 201a of the first connection line 201 does not overlap the data line DL, but according to some example embodiments, the first portion 201a of the first connection line 201 may overlap the data line DL. In FIG. 9B, the third connection line 205 does not overlap the fourth connection line 207, but according to some example embodiments, the third connection line 205 may overlap the fourth connection line 207.

Referring again to FIG. 8, a plurality of pads are arranged in the pad area PADA to transmit the first to third data signals Dr, Dg, and Db applied from the data driver D_IC to the third connection lines 205 and the fourth connection lines 207. The first data signal Dr and the third data signal Db may be alternately applied to a first pad P1, a third pad P3, a fifth pad P5, and a seventh pad P7, and the like, which are odd-numbered pads. The second data signal Dg may be applied to a second pad P2, a fourth pad P4, a sixth pad P6, an eighth pad P8, and the like, which are even-numbered pads. In two pad units, the fourth connection lines 207 and the third connection lines 205 may be alternately connected to the pads. For example, the fourth connection lines 207 may be connected to the first pad P1 and the second pad P2, and the third connection lines 205 may be connected to the third pad P3 and the fourth pad P4.

Hereinafter, for convenience of explanation, a transmission path of a data signal will be described using the respective first to fourth data lines DL1 to DL4 of first to fourth column groups CG1 to CG4 from the left side. In FIG. 8, the second connection lines 203 may route the first connection line 201 and the data line DL between two columns.

The first data signal Dr may be applied to the first pixels PX1, the second data signal Dg may be applied to the second pixels PX2, and the third data signal Db may be applied to the third pixels PX3. The first data signal Dr or the third data signal Db may be applied to first data lines DL1 of the first columns C1 and third data lines DL3 of the third columns C3. The second data signal Dg may be applied to second data lines DL2 of the second columns C2 and fourth data lines DL4 of the fourth columns C4.

The first data signal Dr or the third data signal Db may be applied to the first data line DL1 of a third column group CG3 through a fourth connection line 207_1 connected to the first pad P1. The second data signal Dg may be applied to the second data line DL2 of the third column group CG3 through a fourth connection line 207_2 connected to the second pad P2. The first data signal Dr or the third data signal Db may be applied to the third data line DL3 of a second column group CG2 through a third connection line 205_1, the first connection line 201_1, and a second connection line 203_1 connected to the third pad P3. The second data signal Dg may be applied to the fourth data line DL4 of the second column group CG2 through a third connection line 205_2, a first connection line 201_2, and a second connection line 203_2 connected to the fourth pad P4.

The first data signal Dr or the third data signal Db may be applied to the third data line DL3 of the third column group CG3 through a fourth connection line 207_3 connected to the fifth pad P5. The second data signal Dg may be applied to the fourth data line DL4 of the third column group CG3 through a fourth connection line 207_4 connected to the sixth pad P6. The first data signal Dr or the third data signal Db may be applied to the first data line DL1 of the second column group CG2 through a third connection line 205_3, the first connection line 201_3, and a second connection line 203_3 connected to the seventh pad P7. The second data signal Dg may be applied to the second data line DL2 of the second column group CG2 through a third connection line 205_4, a first connection line 201_4, and a second connection line 203_4 connected to the eighth pad P8.

In similar, the first to third data signals Dr, Dg, and Db applied to ninth to sixteenth pads P9 to P16 may be applied to the first and fourth data lines DL1 to DL4 of the fourth column group CG4 and the first column group CG1 through the first to fourth connection lines 201, 203, 205, and 207.

Figure 10:
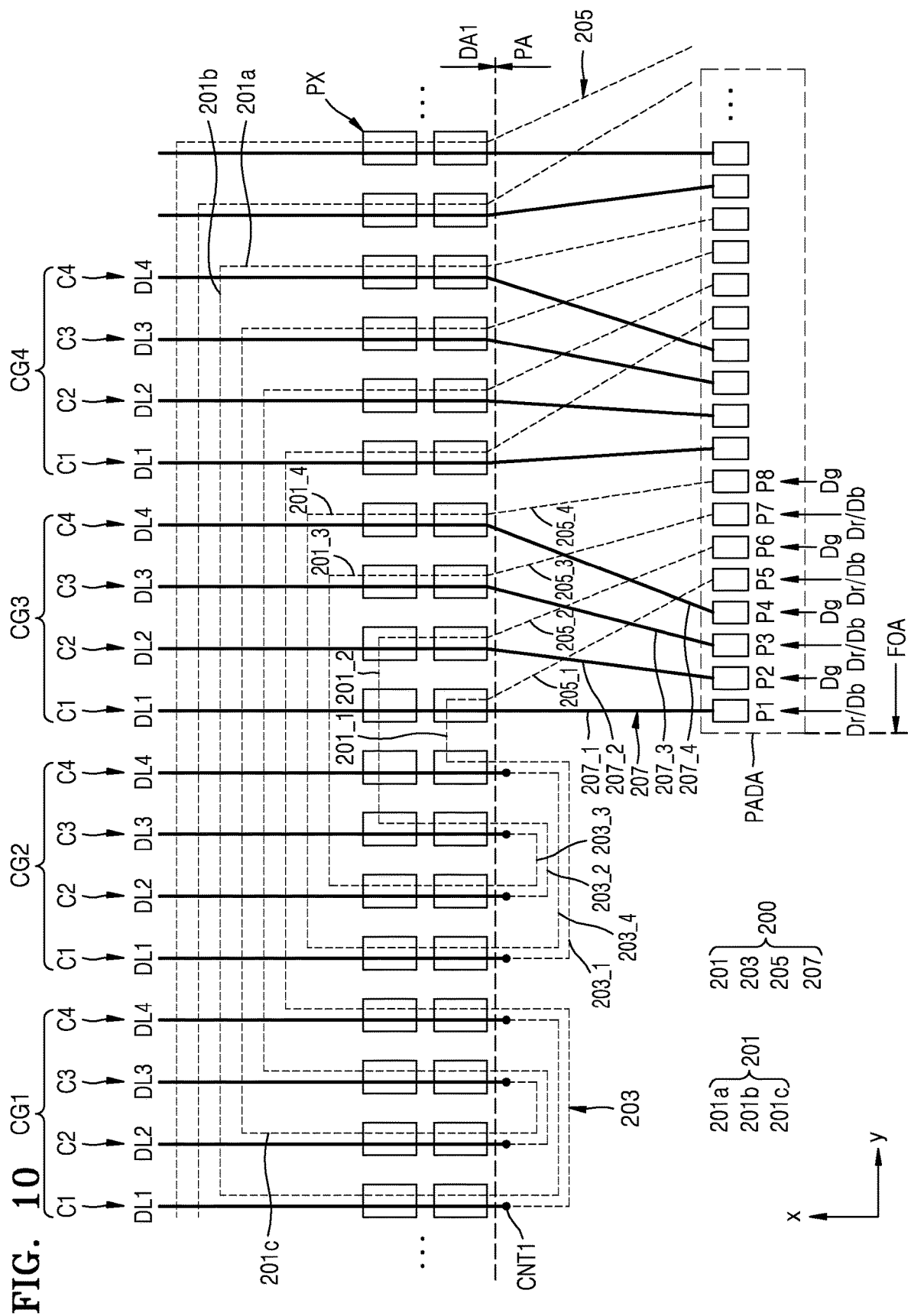
FIGS. 10 and 11 are plan views of another example of region C of FIG. 1 to which the pixel array of FIG. 7 is applied.

FIG. 10 is a plan view of another example of region C in FIG. 1 to which the pixel array of FIG. 7 is applied. Hereinafter, detailed description of the same configuration as the above description will not be given herein.

Referring to FIG. 10, four second connection lines 203 may be spaced apart from each other between four adjacent columns. The second connection line 203 may be connected to a data line arranged in a column different from a column in which the third portion 201c of the first connection line 201 is located. A column in which a data line connected to the second connection line 203 is located and a column in which the third portion 201c of the first connection line 201 connected to the second connection line 203 is located may be spaced apart by at least one column. In some (e.g., the second connection lines 203_2 and 203_3) of the second connection lines 203, the column in which the data line connected to the second connection line 203 is located may be a column immediately adjacent to the column in which the third portion 201c of the first connection line 201 connected to the second connection line 203 is located. In some (e.g., the second connection lines 203_1 and 203_4) of the second connection lines 203, the column in which the data line connected to the second connection line 203 is located may be a column spaced apart by a plurality of columns (e.g., four columns) from the column in which the third portion 201c of the first connection line 201 connected to the second connection line 203 is located.

In four pad units, the fourth connection lines 207 and the third connection lines 205 may be alternately connected to the pads. For example, the fourth connection lines 207 may be connected to the first to fourth pads P1 to P4, and the third connection lines 205 may be connected to the fifth to eighth pads P5 to P8.

Hereinafter, a transmission path of a data signal will be described using the respective first to fourth data lines DL1 to DL4 of first to fourth column groups CG1 to CG4 from the left side. In FIG. 10, the number of output channels of the data driver D_IC is four, and the second connection lines 203 may route the first connection line 201 and the data line DL between four columns.

The first data signal Dr or the third data signal Db may be applied to the first data line DL1 of a third column group CG3 through the fourth connection line 207_1 connected to the first pad P1. The second data signal Dg may be applied to the second data line DL2 of the third column group CG3 through the fourth connection line 207_2 connected to the second pad P2. The first data signal Dr or the third data signal Db may be applied to the third data line DL3 of the third column group CG3 through the fourth connection line 207_3 connected to the third pad P3. The second data signal Dg may be applied to the fourth data line DL4 of the third column group CG3 through the fourth connection line 207_4 connected to the fourth pad P4.

The first data signal Dr or the third data signal Db may be applied to the first data line DL1 of the second column group CG2 through the third connection line 205_1, the first connection line 201_1, and the second connection line 203_1 connected to the fifth pad P5. The second data signal Dg may be applied to the second data line DL2 of the second column group CG2 through the third connection line 205_2, the first connection line 201_2, and the second connection line 203_2 connected to the sixth pad P6. The first data signal Dr or the third data signal Db may be applied to the third data line DL3 of the second column group CG2 through the third connection line 205_3, the first connection line 201_3, and the second connection line 203_3 connected to the seventh pad P7. The second data signal Dg may be applied to the fourth data line DL4 of the second column group CG2 through the third connection line 205_4, the first connection line 201_4, and the second connection line 203_4 connected to the eighth pad P8.

In similar, the first to third data signals Dr, Dg, and Db applied to the ninth to sixteenth pads P9 to P16 may be applied to the first and fourth data lines DL1 to DL4 of the fourth column group CG4 and the first column group CG1 through the first to fourth connection lines 201, 203, 205, and 207.

Figure 11:
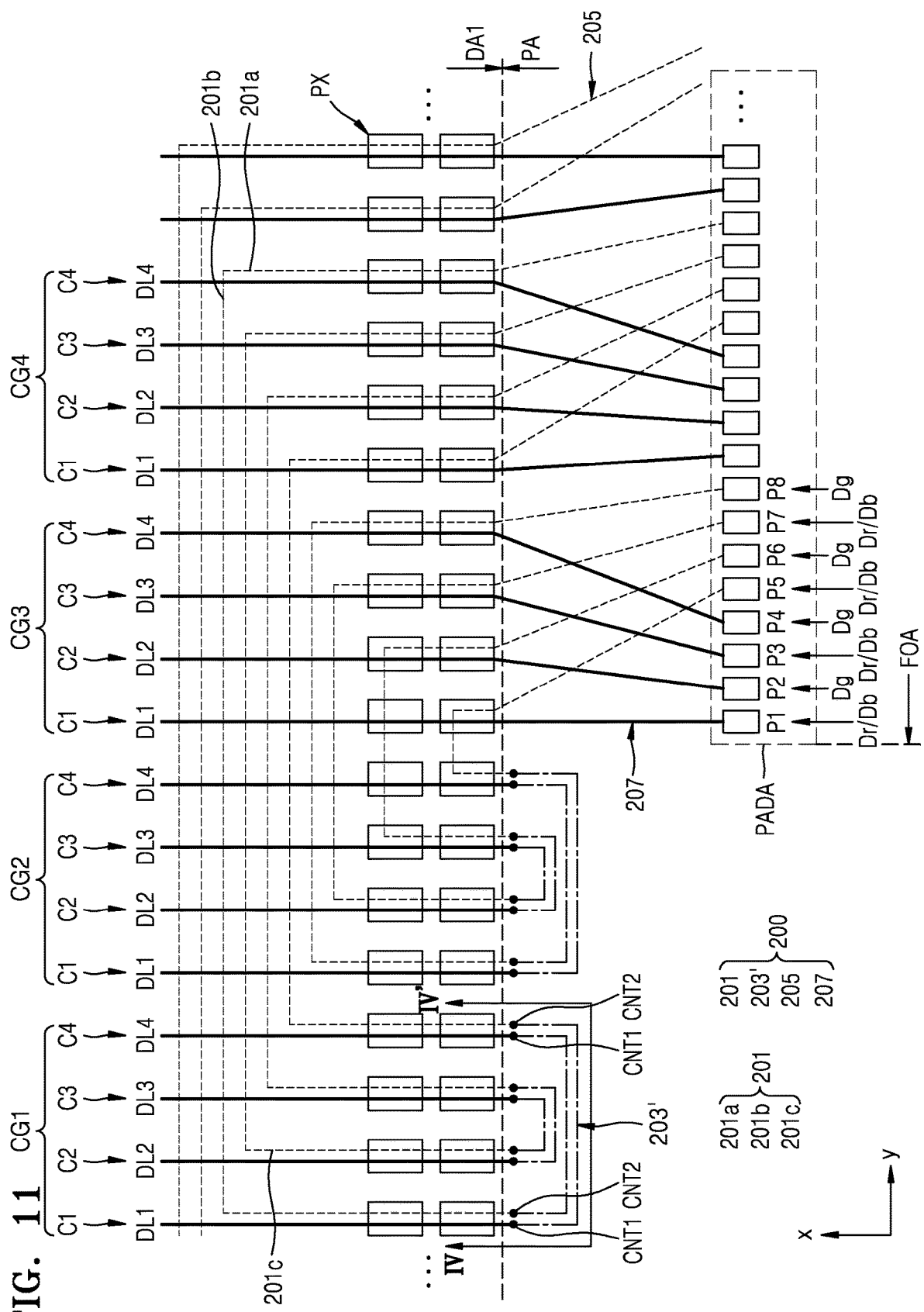
Figure 12A:
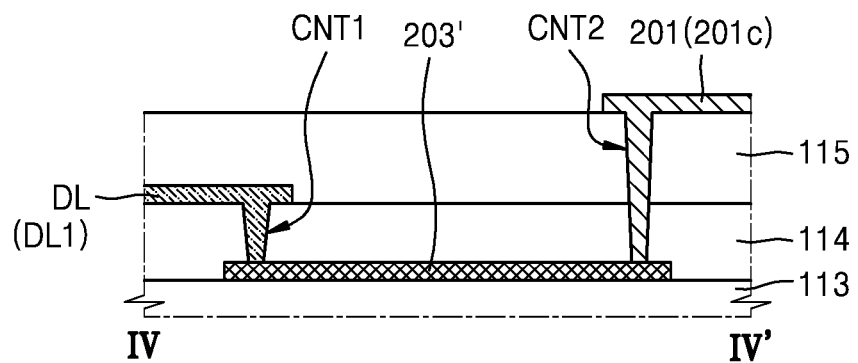
FIGS. 12A to 12C are cross-sectional views taken along the line IV-IV' in FIG. 11.
Figure 12B:
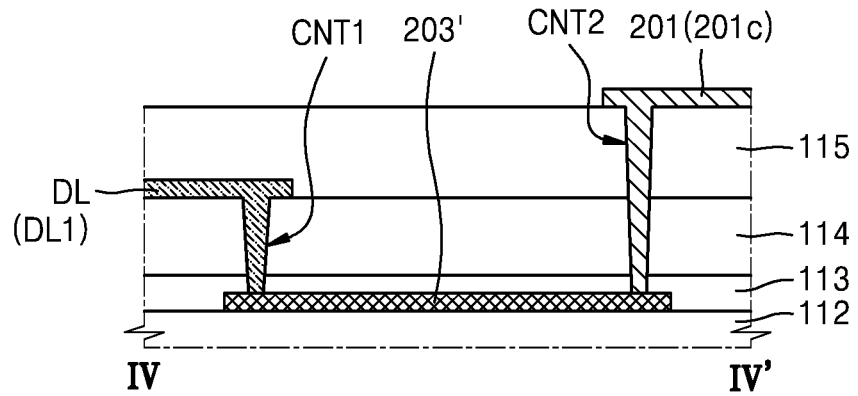
Figure 12C:
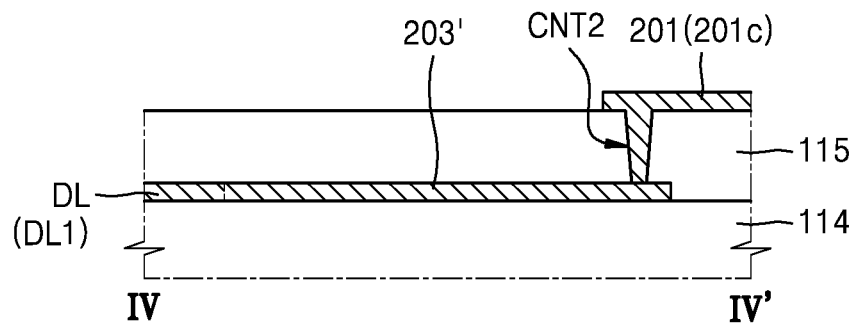

FIG. 11 is a plan view of another example of region C in FIG. 1 to which the pixel array of FIG. 7 is applied. FIGS. 12A to 12C are cross-sectional views taken along line IV-IV' in FIG. 11. FIGS. 12A to 12C are views illustrating a positional relationship between the data line DL, the first connection line 201, and the second connection line 203'. Hereinafter, detailed description of the same configuration as in FIG. 10 will not be given herein.

Referring to FIG. 11, one end of each of second connection lines 203' may be connected to the data line DL, and the other end thereof may be connected to the third portion 201c of the first connection line 201.

According to some example embodiments, as shown in FIG. 12A, a second connection line 203' may be located on the second insulating layer 113, the data line DL may be located on the third insulating layer 114, and the first connection line 201 may be located on the fourth insulating layer 115. One end of the second connection line 203' may be electrically connected to the data line DL through a contact hole of the third insulating layer 114 in the first contact portion CNT1. The other end of the second connection line 203' may be electrically connected to the third portion 201c of the first connection line 201 through the contact hole of the third insulating layer 114 and the fourth insulating layer 115 in the second contact portion CNT2. The second connection line 203' may include the same material as the material of the upper electrode CE2 of the capacitor Cst.

According to some example embodiments, as shown in FIG. 12B, the second connection line 203' may be on the first insulating layer 112. One end of the second connection line 203' may be electrically connected to the data line DL through the contact hole of the second insulating layer 113 and the third insulating layer 114 in the first contact portion CNT1. The other end of the second connection line 203' may be electrically connected to the third portion 201c of the first connection line 201 through the contact hole of the second insulating layer 113, the third insulating layer 114, and the fourth insulating layer 115 in the second contact portion CNT2. The second connection line 203' may include the same material as the material of the lower electrode CE1 of the capacitor Cst.

According to some example embodiments, as shown in FIG. 12C, the second connection line 203' may be on the same layer as that of the data line DL, that is, on the first insulating layer 112. One end of the second connection line 203' may be connected to the data line DL, and the other end thereof may be electrically connected to the third portion 201c of the first connection line 201 through the contact hole of the fourth insulating layer 115 in the second contact portion CNT2. The second connection line 203' may be a portion in which the data line DL extends to the peripheral area PA. The second connection line 203' may be integrally formed with the data line DL.

The arrangement of the data line DL, the first connection line 201, and the second connection line 203' of FIGS. 12A to 12C may be similarly applied to the embodiment of FIG. 8.

Figure 13:
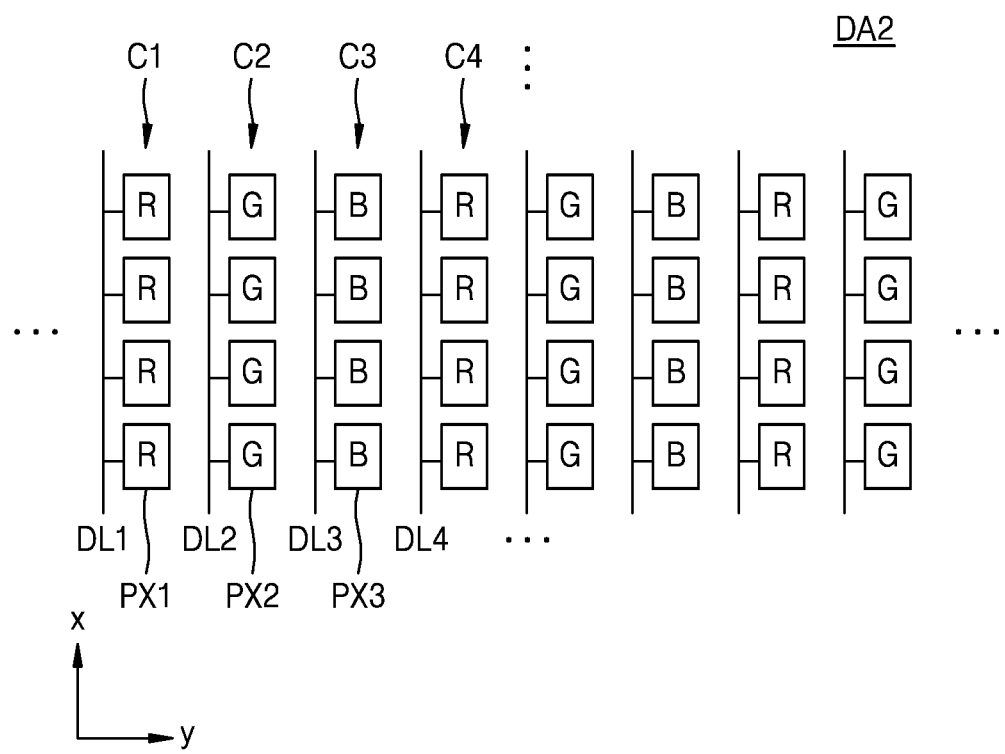
FIG. 13 is a view of a pixel array according to some example embodiments.

FIG. 13 is a view of a pixel array according to some example embodiments.

Referring to FIG. 13, in a display area DA2, the plurality of pixels PX may be arranged along a column in the x direction and a row in the y direction. The pixels PX may include the plurality of first pixels PX1 displaying a first color, the plurality of second pixels PX2 displaying a second color, and the plurality of third pixels PX3 displaying a third color. According to some example embodiments, the first pixel PX1 may be the red pixel R, the second pixel PX2 may be the green pixel G, and the third pixel PX3 may be the blue pixel B.

The first pixel PX1 may be repeatedly arranged in the x direction in the first column C1 and electrically connected to the first data line DL1. The second pixel PX2 may be repeatedly arranged in the x direction in the second column C2 adjacent to the first column C1 and electrically connected to the second data line DL2. The third pixel PX3 may be repeatedly arranged in the x direction in the third column C3 adjacent to the second column C2 and electrically connected to the third data line DL3. The first to third columns C1 to C3 may be repeated in the y direction.

Figure 14:
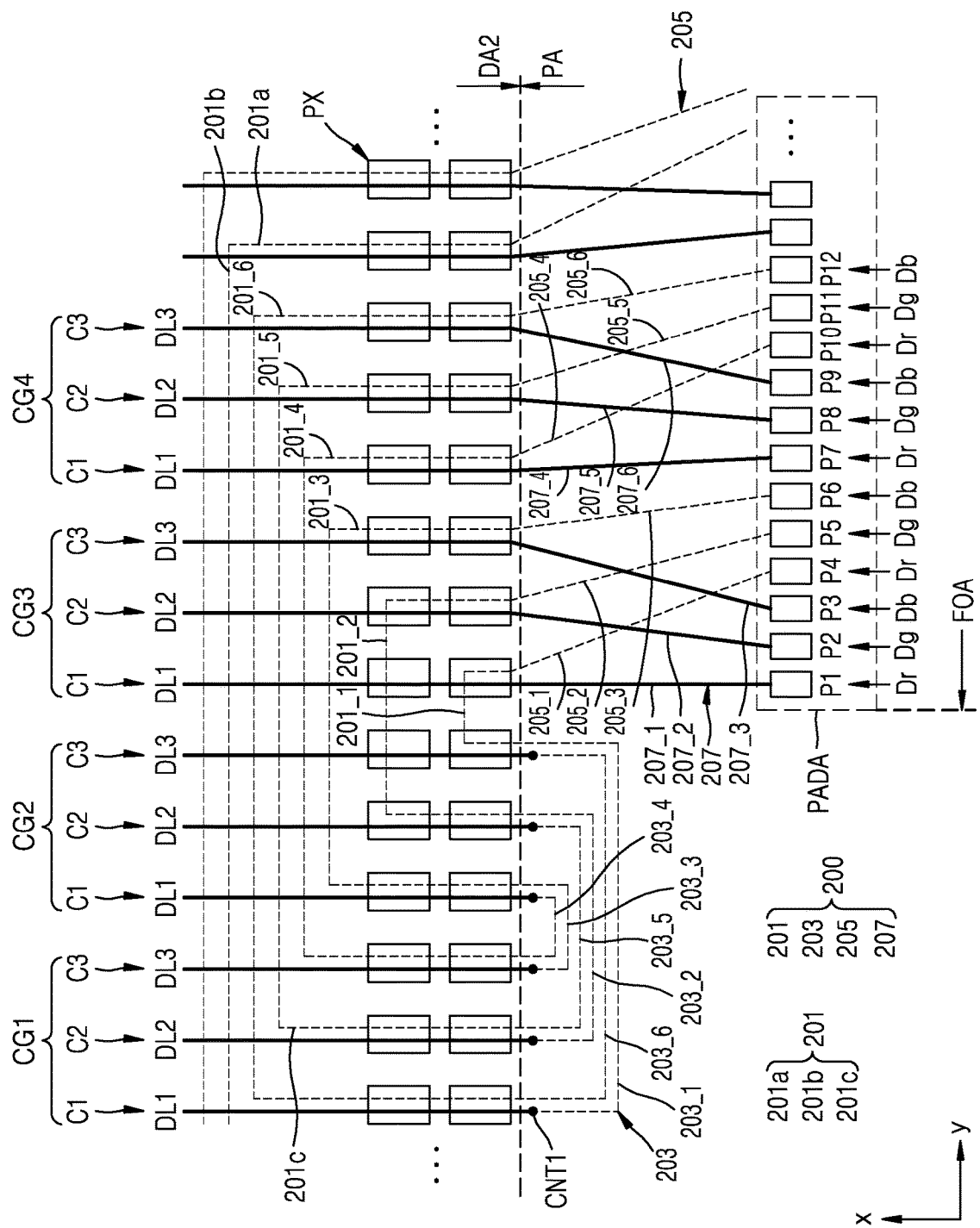
FIGS. 14 and 15 are plan views of an example of region C of FIG. 1 to which the pixel array of FIG. 13 is applied.

FIG. 14 is a plan view of an example of region C in FIG. 1 to which the pixel array of FIG. 13 is applied. Hereinafter, a configuration different from that of FIG. 8 will be mainly described.

Referring to FIG. 14, in the display area DA2, the first data line DL1 may be located in each of the first columns C1, the second data line DL2 may be located in each of the second columns C2, and the third data line DL3 may be located in each of the third columns C3. The first to third data lines DL1 to DL3 may be repeated in the y direction.

The plurality of connection lines 200 may include the plurality of first connection lines 201 and the plurality of second connection lines 203. The first connection lines 201 may be arranged in the display area DA2, and the second connection lines 203 may be arranged in the peripheral area PA other than the fan-out area FOA. The plurality of connection lines 200 may further include the plurality of third connection lines 205 and the plurality of fourth connection lines 207. The third connection lines 205 and the fourth connection lines 207 may be arranged in the peripheral area PA. The third connection lines 205 and the fourth connection lines 207 may be arranged in the fan-out area FOA.

Each of the first connection lines 201 may include the first portion 201a extending in the +x direction, the second portion 201b extending in the y direction, and the third portion 201c extending in the −x direction. The second portion 201b may connect the first portion 201a and the third portion 201c with each other.

Six second connection lines 203 may be spaced apart from each other between six adjacent columns. Each of the second connection lines 203 may be connected to a data line arranged in a column different from a column in which the third portion 201c of the first connection line 201 is located. The column in which the data line connected to the second connection line 203 is located and the column in which the third portion 201c of the first connection line 201 connected to the second connection line 203 is located may be spaced apart by at least one column. In some (e.g., the second connection lines 203_3 and 203_4) of the second connection lines 203, the column in which the data line connected to the second connection line 203 is located may be a column immediately adjacent to the column in which the third portion 201c of the first connection line 201 connected to the second connection line 203 is located. In some (e.g., the second connection lines 203_2 and 203_5, and 203_1 and 203_6) of the second connection lines 203, the column in which the data line connected to the second connection line 203 is located may be a column spaced apart by a plurality of columns (e.g., four columns or six columns) from the column in which the third portion 201c of the first connection line 201 connected to the second connection line 203 is located.

The first connection lines 201 do not cross each other in the display area DA2 by the second connection lines 203, and the first connection lines 201 may transmit the first to third data signals Dr, Dg, and Db to the first to third data lines DL1 to DL3 in accordance with a sequence of the first to third data signals Dr, Dg, and Db regularly output by the data driver D_IC.

A plurality of pads are arranged in the pad area PADA to transmit the first to third data signals Dr, Dg, and Db applied from the data driver D_IC to the third connection lines 205 and the fourth connection lines 207. For example, the first data signal Dr may be applied to the first pad P1, the fourth pad P4, the seventh pad P7, and the like. The second data signal Dg may be applied to the second pad P2, the fifth pad P5, and the eighth pad P8. The third data signal Db may be applied to the third pad P3, the sixth pad P6, the ninth pad P9, and the like. In three pad units, the fourth connection lines 207 and the third connection lines 205 may be alternately connected to the pads. For example, the fourth connection lines 207 may be connected to the first to fourth pads P1 to P4, and the third connection lines 205 may be connected to the fifth to eighth pads P5 to P8.

Hereinafter, a transmission path of a data signal will be described using the respective first to third data lines DL1 to DL3 of first to fourth column groups CG1 to CG4 from the left side. In FIG. 14, the number of output channels of the data driver D_IC is three, and the second connection lines 203 may route the first connection line 201 and the data line DL between six columns.

The first data signal Dr may be applied to the first pixels PX1, the second data signal Dg may be applied to the second pixels PX2, and the third data signal Db may be applied to the third pixels PX3. The first data signal Dr may be applied to the first data lines DL1 of the first columns C1. The second data signal Dg may be applied to the second data lines DL2 of the second columns C2. The third data signal Db may be applied to the third data lines DL3 of the third columns C3.

The first data signal Dr may be applied to the first data line DL1 of a third column group CG3 through the fourth connection line 207_1 connected to the first pad P1. The second data signal Dg may be applied to the second data line DL2 of the third column group CG3 through the fourth connection line 207_2 connected to the second pad P2. The third data signal Db may be applied to the third data line DL3 of the third column group CG3 through the fourth connection line 207_3 connected to the third pad P3. The first data signal Dr may be applied to the first data line DL1 of the first column group CG1 through the third connection line 205_1, the first connection line 201_1, and the second connection line 203_1 connected to the fourth pad P4. The second data signal Dg may be applied to the second data line DL2 of the first column group CG1 through the third connection line 205_2, the first connection line 201_2, and the second connection line 203_2 connected to the fifth pad P5. The third data signal Db may be applied to the third data line DL3 of the first column group CG1 through the third connection line 205_3, the first connection line 201_3, and the second connection line 203_3 connected to the sixth pad P6.

The first data signal Dr may be applied to the first data line DL1 of the fourth column group CG4 through the fourth connection line 207_4 connected to the seventh pad P7. The second data signal Dg may be applied to the second data line DL2 of the fourth column group CG4 through the fourth connection line 207_5 connected to the eighth pad P8. The third data signal Db may be applied to the third data line DL3 of the fourth column group CG4 through the fourth connection line 207_6 connected to the ninth pad P9. The first data signal Dr may be applied to the first data line DL1 of the second column group CG1 through the third connection line 205_4, the first connection line 201_4, and the second connection line 203_4 connected to the tenth pad P10. The second data signal Dg may be applied to the second data line DL2 of the second column group CG2 through the third connection line 205_5, the first connection line 201_5, and the second connection line 203_5 connected to the eleventh pad P11. The third data signal Db may be applied to the third data line DL3 of the second column group CG2 through the third connection line 205_6, the first connection line 201_6, and the second connection line 203_6 connected to the twelfth pad P12.

Figure 15:
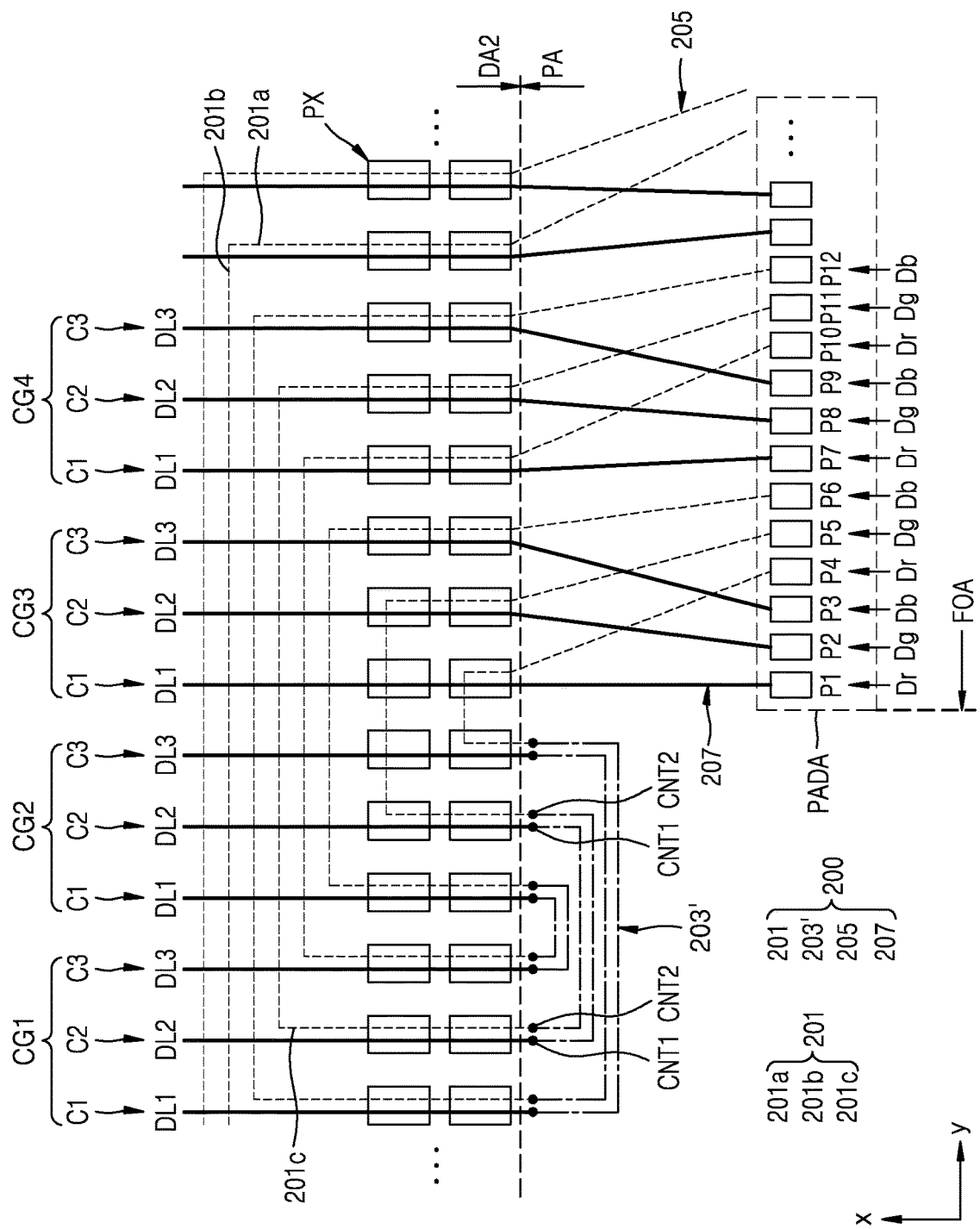

FIG. 15 is a plan view of another example of region C in FIG. 1 to which the pixel array of FIG. 13 is applied. Hereinafter, detailed description of the same configuration as in FIG. 14 will not be given herein.

Referring to FIG. 15, one end of each of second connection lines 203' may be connected to the data line DL, and the other end thereof may be connected to the third portion 201c of the first connection line 201.

According to some example embodiments, as illustrated in FIG. 12A, one end of the second connection line 203' may be electrically connected to the data line DL through the contact hole of the third insulating layer 114 in the first contact portion CNT1. The other end of the second connection line 203' may be electrically connected to the third portion 201c of the first connection line 201 through the contact hole of the third insulating layer 114 and the fourth insulating layer 115 in the second contact portion CNT2. The second connection line 203' may include the same material as the material of the upper electrode CE2 of the capacitor Cst.

According to some example embodiments, as illustrated in FIG. 12B, one end of the second connection line 203' may be electrically connected to the data line DL through the contact hole of the second insulating layer 113 and the third insulating layer 114 in the first contact portion CNT1. The other end of the second connection line 203' may be electrically connected to the third portion 201c of the first connection line 201 through the contact hole of the second insulating layer 113, the third insulating layer 114, and the fourth insulating layer 115 in the second contact portion CNT2. The second connection line 203' may include the same material as the material of the lower electrode CE1 of the capacitor Cst.

According to some example embodiments, as illustrated in FIG. 12C, one end of the second connection line 203' may be connected to the data line DL, and the other end thereof may be electrically connected to the third portion 201c of the first connection line 201 through the contact hole of the fourth insulating layer 115 in the second contact portion CNT2. The second connection line 203' may be a portion in which the data line DL extends to the peripheral area PA. The second connection line 203' may be integrally formed with the data line DL.

Figure 16:
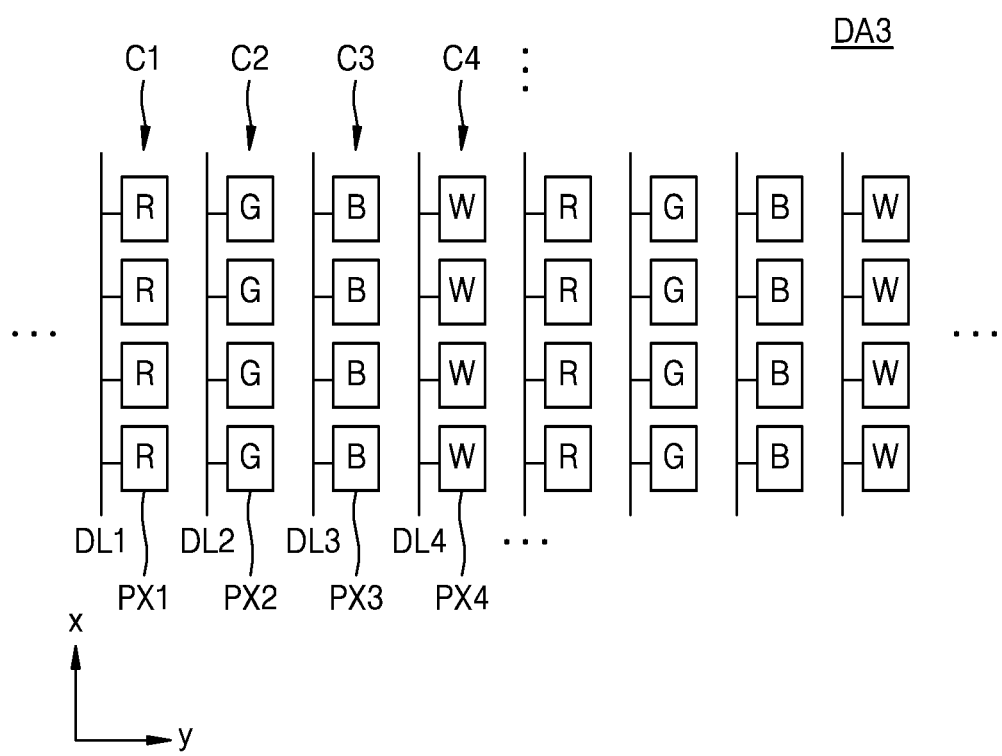
FIG. 16 is a view of a pixel array according to some example embodiments.

FIG. 16 is a view of a pixel array according to some example embodiments.

Referring to FIG. 16, in a display area DA3, the plurality of pixels PX may be arranged along a column in the x direction and a row in the y direction. The pixels PX may include the plurality of first pixels PX1 displaying a first color, the plurality of second pixels PX2 displaying a second color, the plurality of third pixels PX3 displaying a third color, and a plurality of fourth pixels PX4 displaying a fourth color. According to some example embodiments, the first pixel PX1 may be the red pixel R, the second pixel PX2 may be the green pixel G, the third pixel PX3 may be the blue pixel B, and a fourth pixel PX4 may be a white pixel W.

The first pixel PX1 may be repeatedly arranged in the x direction in the first column C1 and electrically connected to the first data line DL1. The second pixel PX2 may be repeatedly arranged in the x direction in the second column C2 adjacent to the first column C1 and electrically connected to the second data line DL2. The third pixel PX3 may be repeatedly arranged in the x direction in the third column C3 adjacent to the second column C2 and electrically connected to the third data line DL3. The fourth pixel PX4 may be repeatedly arranged in the x direction in the fourth column C4 adjacent to the third column C3 and electrically connected to the fourth data line DL4. The first to fourth columns C1 to C4 may be repeated in the y direction.

Figure 17:
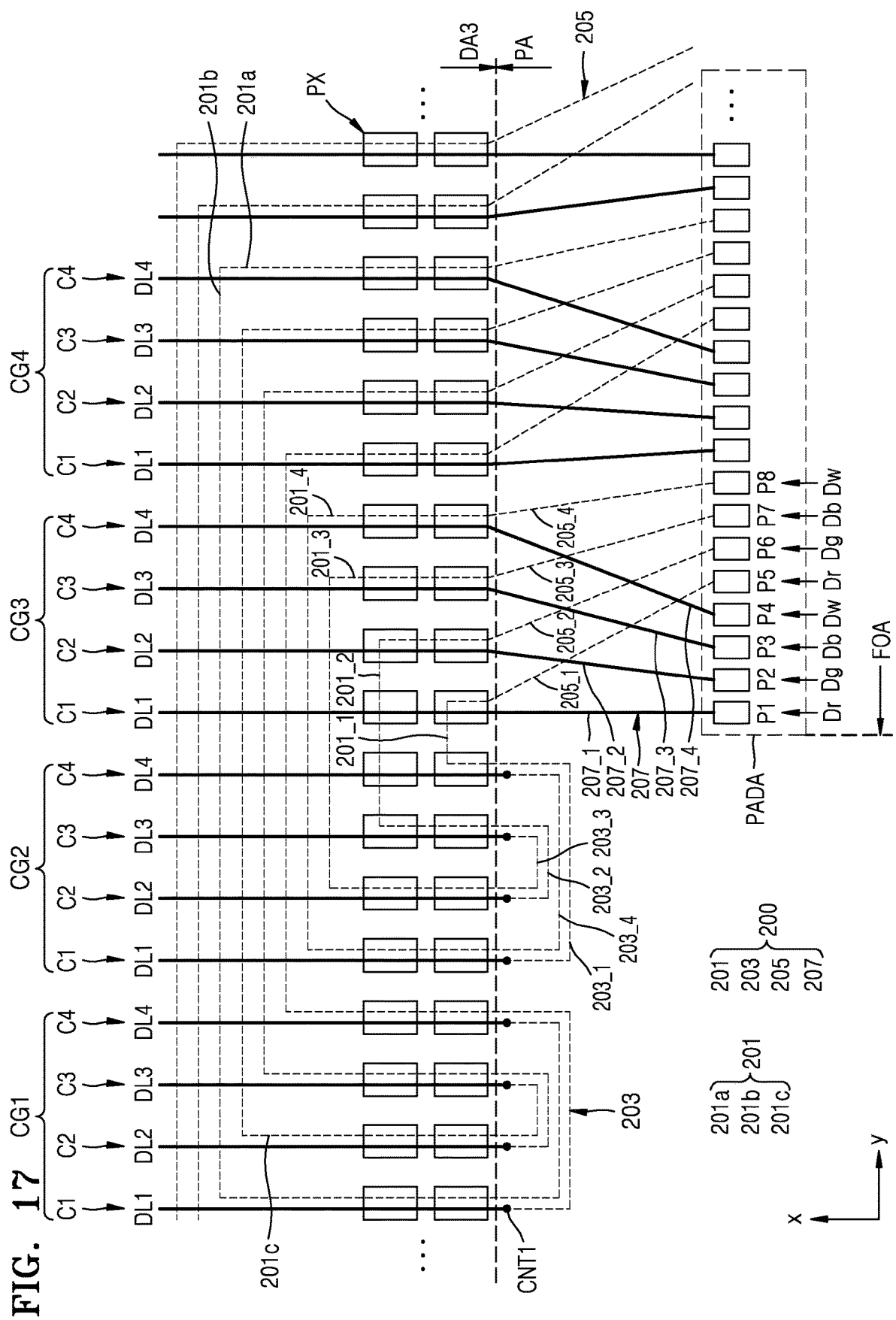
FIGS. 17 and 18 are plan views of an example of region C of FIG. 1 to which the pixel array of FIG. 16 is applied.

FIG. 17 is a plan view of an example of region C in FIG. 1 to which the pixel array of FIG. 16 is applied. Hereinafter, a configuration different from that of FIG. 8 will be mainly described.

Referring to FIG. 17, in the display area DA3, the first data line DL1 may be located in each of the first columns C1, the second data line DL2 may be located in each of the second columns C2, the third data line DL3 may be located in each of the third columns C3, and the fourth data line DL4 may be located in each of the fourth columns C4. The first to fourth data lines DL1 to DL4 may be repeated in the y direction.

The plurality of connection lines 200 may include the plurality of first connection lines 201 and the plurality of second connection lines 203. The first connection lines 201 may be arranged in the display area DA3, and the second connection lines 203 may be arranged in the peripheral area PA other than the fan-out area FOA. The plurality of connection lines 200 may further include the plurality of third connection lines 205 and the plurality of fourth connection lines 207. The third connection lines 205 and the fourth connection lines 207 may be arranged in the peripheral area PA. The third connection lines 205 and the fourth connection lines 207 may be arranged in the fan-out area FOA.

Each of the first connection lines 201 may include the first portion 201a extending in the +x direction, the second portion 201b extending in the y direction, and the third portion 201c extending in the −x direction. The second portion 201b may connect the first portion 201a and the third portion 201c with each other.

Four fourth connection lines 203 may be spaced apart from each other between four adjacent columns. Each of the second connection lines 203 may be connected to a data line arranged in a column different from a column in which the third portion 201c of the first connection line 201 is located. The column in which the data line connected to the second connection line 203 is located and the column in which the third portion 201c of the first connection line 201 connected to the second connection line 203 is located may be spaced apart by at least one column. In some (e.g., the second connection lines 203_2 and 203_3) of the second connection lines 203, the column in which the data line connected to the second connection line 203 is located may be a column immediately adjacent to the column in which the third portion 201c of the first connection line 201 connected to the second connection line 203 is located. In some (e.g., the second connection lines 203_1 and 203_4) of the second connection lines 203, the column in which the data line connected to the second connection line 203 is located may be a column spaced apart by a plurality of columns (e.g., four columns) from the column in which the third portion 201c of the first connection line 201 connected to the second connection line 203 is located.

The first connection lines 201 do not cross each other in the display area DA3 by the second connection lines 203, and the first connection lines 201 may transmit the first to third data signals Dr, Dg, and Db to the first to fourth data lines DL1 to DL4 in accordance with a sequence of the first to fourth data signals Dr, Dg, Db and Dw regularly output by the data driver D_IC.

A plurality of pads are arranged in the pad area PADA to transmit first to fourth data signals Dr, Dg, Db, and Dw applied from the data driver D_IC to the third connection lines 205 and the fourth connection lines 207. For example, the first data signal Dr may be applied to the first pad P1, the fifth pad P5, the ninth pad P9, and the like. The second data signal Dg may be applied to the second pad P2, the sixth pad P6, and the tenth pad P10. The third data signal Db may be applied to the third pad P3, the seventh pad P7, the eleventh pad P11, and the like. The fourth data signal Dw may be applied to the fourth pad P4, the eighth pad P8, the twelfth pad P12, and the like. In four pad units, the fourth connection lines 207 and the third connection lines 205 may be alternately connected to the pads. For example, the fourth connection lines 207 may be connected to the first to fourth pads P1 to P4, and the third connection lines 205 may be connected to the fifth to eighth pads P5 to P8.

Hereinafter, a transmission path of a data signal will be described using the first to fourth data lines DL1 to DL4 of the first to fourth column groups CG1 to CG4, respective, from the left side. In FIG. 17, the number of output channels of the data driver D_IC is four, and the second connection lines 203 may route the first connection line 201 and the data line DL between four columns.

The first data signal Dr may be applied to the first pixels PX1, the second data signal Dg may be applied to the second pixels PX2, the third data signal Db may be applied to the third pixels PX3, and the fourth data signal Dw may be applied to the fourth pixels PX4. The first data signal Dr may be applied to the first data lines DL1 of the first columns C1. The second data signal Dg may be applied to the second data lines DL2 of the second columns C2. The third data signal Db may be applied to the third data lines DL3 of the third columns C3. The fourth data signal Dw may be applied to the fourth data lines DL4 of the fourth columns C4.

The first data signal Dr may be applied to the first data line DL1 of the third column group CG3 through the fourth connection line 207_1 connected to the first pad P1. The second data signal Dg may be applied to the second data line DL2 of the third column group CG3 through the fourth connection line 207_2 connected to the second pad P2. The third data signal Db may be applied to the third data line DL3 of the third column group CG3 through the fourth connection line 207_3 connected to the third pad P3. The fourth data signal Dw may be applied to the fourth data line DL4 of the third column group CG3 through the fourth connection line 207_4 connected to the fourth pad P4.

The first data signal Dr may be applied to the first data line DL1 of the second column group CG2 through the third connection line 205_1, the first connection line 201_1, and the second connection line 203_1 connected to the fifth pad P5. The second data signal Dg may be applied to the second data line DL2 of the second column group CG2 through the third connection line 205_2, the first connection line 201_2, and the second connection line 203_2 connected to the sixth pad P6. The third data signal Db may be applied to the third data line DL3 of the second column group CG2 through the third connection line 205_3, the first connection line 201_3, and the second connection line 203_3 connected to the seventh pad P7. The fourth data signal Dw may be applied to the fourth data line DL4 of the second column group CG2 through the third connection line 205_4, the first connection line 201_4, and the second connection line 203_4 connected to the eighth pad P8.

In similar, the first to fourth data signals Dr, Dg, Db, and Dw applied to ninth to sixteenth pads P9 to P16 may be applied to the first and fourth data lines DL1 to DL4 of the fourth column group CG4 and the first column group CG1 through the first to fourth connection lines 201, 203, 205, and 207.

Figure 18:
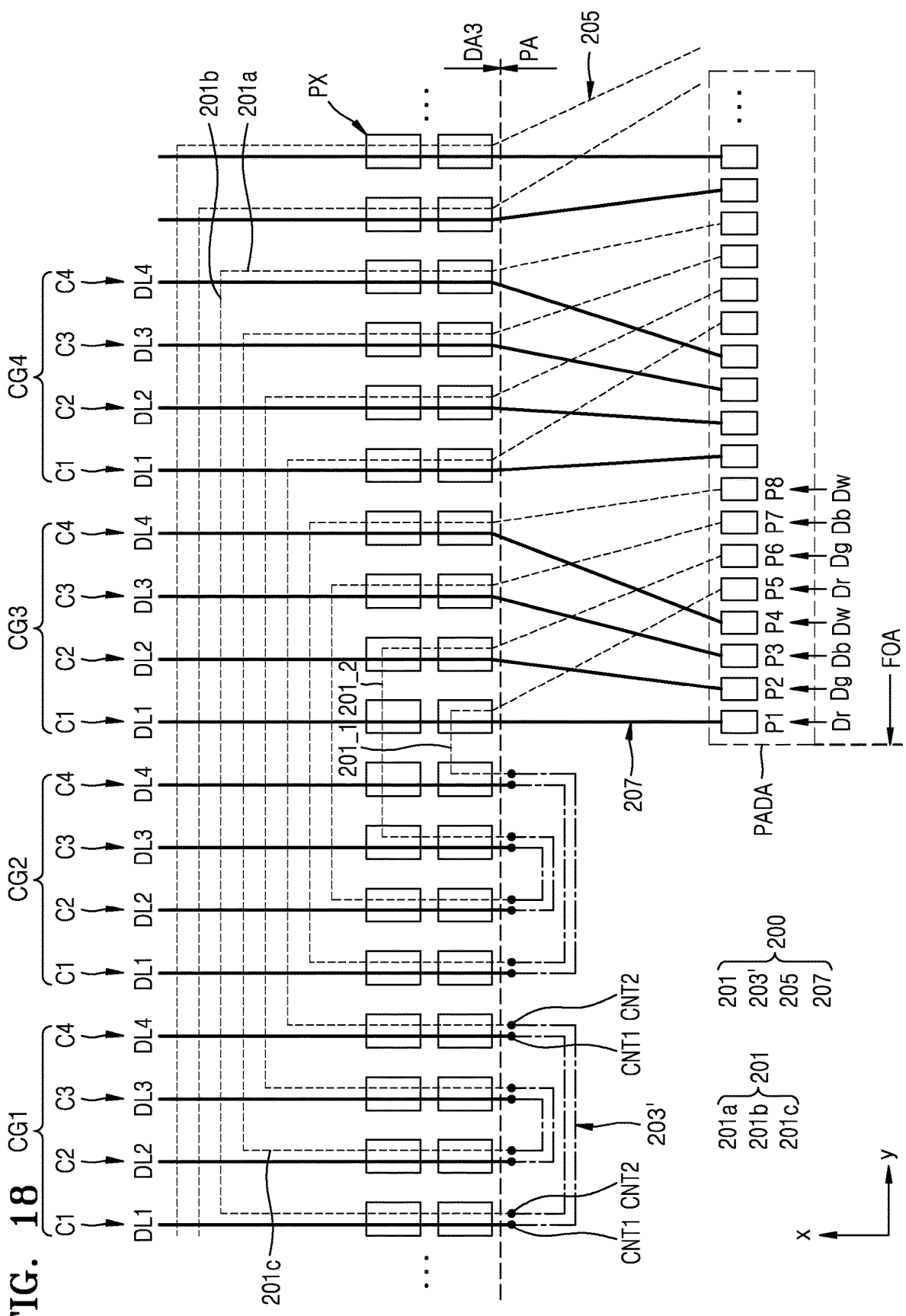

FIG. 18 is a plan view of another example of region C in FIG. 1 to which the pixel array of FIG. 16 is applied. Hereinafter, detailed description of the same configuration as in FIG. 17 will not be given herein.

Referring to FIG. 18, one end of each of second connection lines 203' may be connected to the data line DL, and the other end thereof may be connected to the third portion 201c of the first connection line 201.

According to some example embodiments, as illustrated in FIG. 12A, one end of the second connection line 203' may be electrically connected to the data line DL through the contact hole of the third insulating layer 114 in the first contact portion CNT1. The other end of the second connection line 203' may be electrically connected to the third portion 201c of the first connection line 201 through the contact hole of the third insulating layer 114 and the fourth insulating layer 115 in the second contact portion CNT2. The second connection line 203' may include the same material as the material of the upper electrode CE2 of the capacitor Cst.

According to some example embodiments, as illustrated in FIG. 12B, one end of the second connection line 203' may be electrically connected to the data line DL through the contact hole of the second insulating layer 113 and the third insulating layer 114 in the first contact portion CNT1. The other end of the second connection line 203' may be electrically connected to the third portion 201c of the first connection line 201 through the contact hole of the second insulating layer 113, the third insulating layer 114, and the fourth insulating layer 115 in the second contact portion CNT2. The second connection line 203' may include the same material as the material of the lower electrode CE1 of the capacitor Cst.

According to some example embodiments, as illustrated in FIG. 12C, one end of the second connection line 203' may be connected to the data line DL, and the other end thereof may be electrically connected to the third portion 201c of the first connection line 201 through the contact hole of the fourth insulating layer 115 in the second contact portion CNT2. The second connection line 203' may be a portion in which the data line DL extends to the peripheral area PA. The second connection line 203' may be integrally formed with the data line DL.

Figure 19:
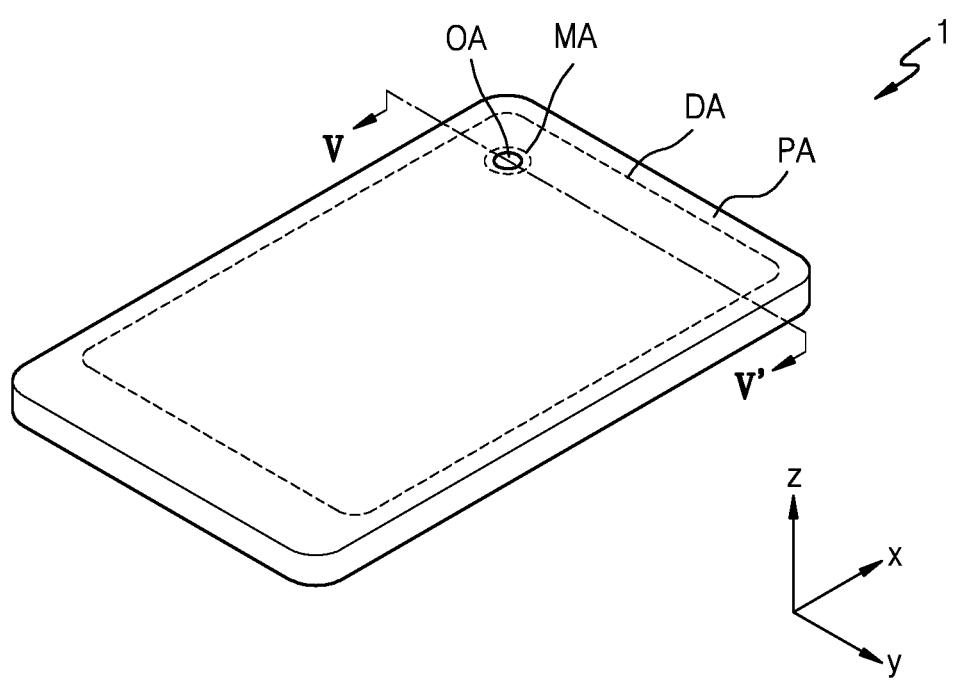
FIG. 19 is a perspective view of a display device including a display panel according to some example embodiments.
Figure 20A:
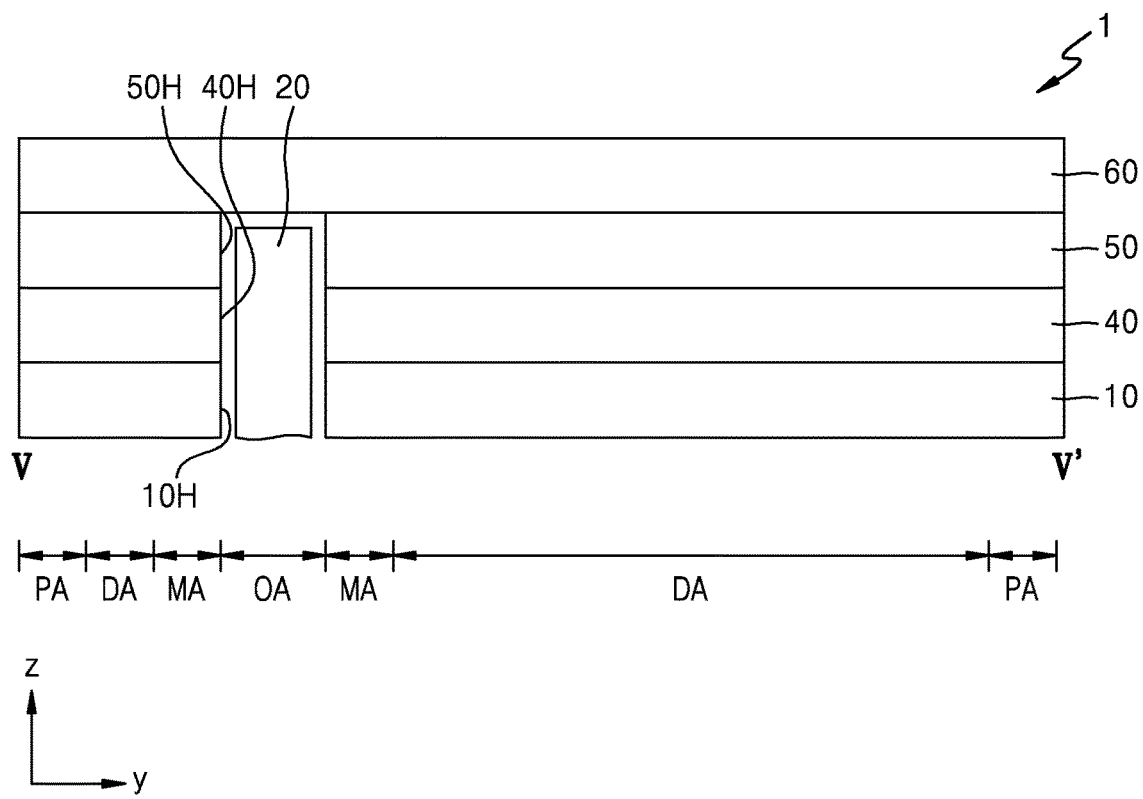
FIGS. 20A and 20B are cross-sectional views taken along the line V-V of FIG. 19, respectively.
Figure 20B:
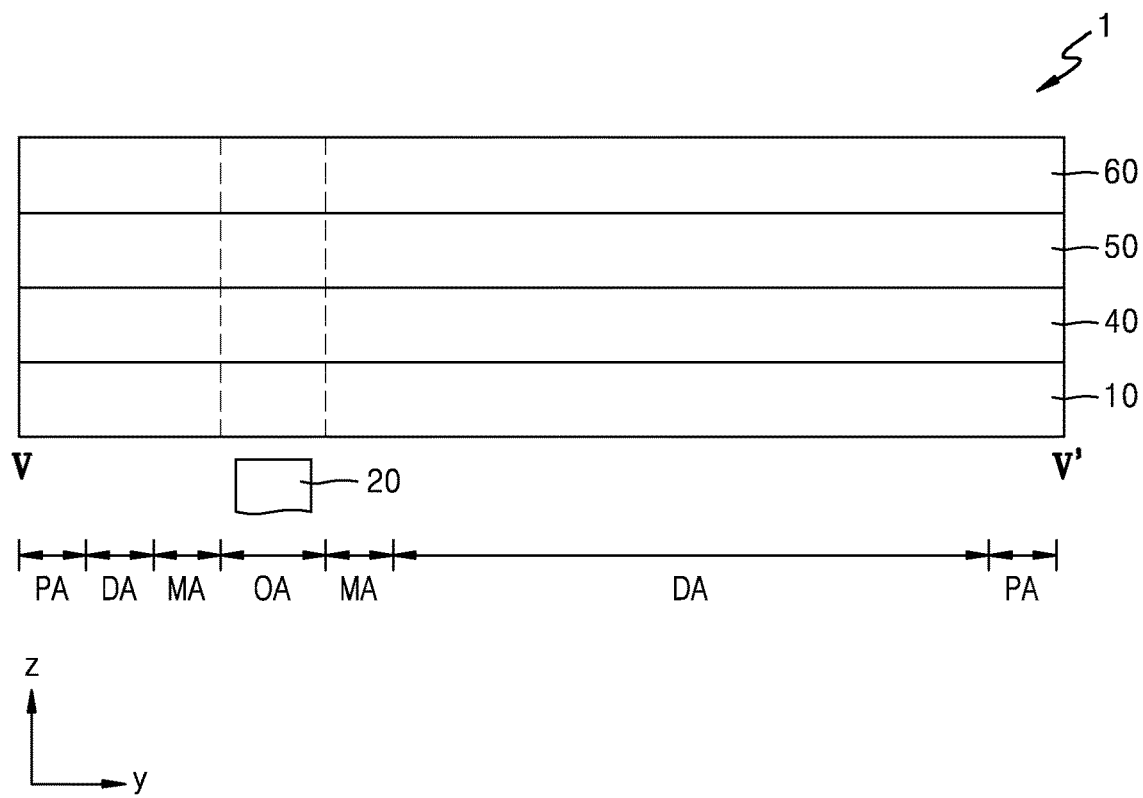

FIG. 19 is a perspective view of a display device including a display panel according to some example embodiments, and FIGS. 20A and 20B are cross-sectional views taken along line V-V' of FIG. 19, respectively.

Referring to FIG. 19, a display device 1 includes a first area OA, the display area DA that is a second area, an intermediate area MA between the first area OA and the display area DA, and the peripheral area PA surrounding the display area DA. The display device 1 may provide a certain image using light emitted from a plurality of pixels arranged in the display area DA. FIG. 19 shows that one first area OA is located inside the display area DA, wherein the first area OA may be entirely surrounded by the display area DA. The first area OA may be an area in which components to be described later below are located with reference to FIGS. 20A and 20B.

The intermediate area MA is located as a third area between the first area OA and the display area DA which is a second area, and the display area DA may be surrounded by the peripheral area PA which is a fourth area. The intermediate area MA and the peripheral area PA may be a kind of non-display area in which pixels are not located. The intermediate area MA may be entirely surrounded by the display area DA, and the display area DA may be entirely surrounded by the peripheral area PA.

The display area DA may include an upper display area that maintains a substantially flat surface and side display areas that extend from the upper display area and are continuous to the upper display area. The upper display area may include round corners. The side display areas may be display areas extending from at least one of four sides of the upper display area. Each of the side display areas may include an area that is curved at a given curvature and an area that is curved approximately vertically.

Referring to FIG. 20A, the display device 1 may include the display panel 10, an input sensing layer 40 on the display panel 10, and an optical functional layer 50, which may be covered with a window 60. The display device 1 may be various kinds of electronic devices such as a mobile phone, a laptop computer, and a smart watch.

The display panel 10 may be the display panel illustrated in FIG. 1. The display panel 10 will be described later below with reference to FIGS. 21A to 22D.

The input sensing layer 40 may be on the display panel 10. The input sensing layer 40 obtains coordinate information according to an external input, for example, a touch event. The input sensing layer 40 may include a sensing electrode (or a touch electrode) and trace lines connected to the sensing electrode. The input sensing layer 40 may be on the display panel 10. The input sensing layer 40 may sense an external input by a mutual cap method and/or a self cap method.

The input sensing layer 40 may be formed directly on the display panel 10 or may be formed separately and then coupled to the display panel 10 through an adhesive layer such as an optical clear adhesive. For example, the input sensing layer 40 may be continuously formed after the process of forming the display panel 10. In this case, the input sensing layer 40 may be a portion of the display panel 10, and the adhesive layer may not be between the input sensing layer 40 and the display panel 10. Although FIG. 20A illustrates that the input sensing layer 40 is between the display panel 10 and the optical functional layer 50, according to some example embodiments, the input sensing layer 40 may be on the optical functional layer 50.

The optical functional layer 50 may include an antireflection layer. The antireflection layer may reduce the reflectance of light (external light) incident from the outside toward the display panel 10 through the window 60. The antireflection layer may include a retarder and a polarizer. The retarder may be of a film type or a liquid crystal coating type, and may include a λ/2 retarder and/or a λ/4 retarder. The polarizer may also be of a film type or a liquid crystal coating type. A film type polarizer may include a stretch-type synthetic resin film, and a liquid crystal coating type polarizer may include liquid crystals arranged in the certain arrangement. The retarder and the polarizer may further include a protective film. The protective film of the retarder and the polarizer may be defined as a base layer of the anti-reflection layer.

According to some example embodiments, the antireflection layer may include a black matrix and color filters. The color filters may be arranged considering the color of light emitted from each of pixels of the display panel 10. Each of the color filters may include a red, green, or blue pigment or dye. Alternatively, each of the color filters may further include a quantum dot in addition to the aforementioned pigment or dye. Alternatively, some of the color filters may not include the aforementioned pigment or dye and may include scattering particles such as titanium oxide.

According to some example embodiments, the antireflection layer may include a destructive interference structure. The destructive interference structure may include a first reflective layer and a second reflective layer on respective layers. First reflected light and second reflected light respectively reflected by the first reflective layer and second reflective layer may be destructively interfered, and thus external light reflectance may be reduced.

The optical functional layer 50 may include a lens layer. The lens layer may improve luminous efficiency of light emitted from the display panel 10 or may reduce color deviation. The lens layer may include a layer having a concave or convex lens shape, and/or may include a plurality of layers having different refractive indices. The optical functional layer 50 may include all or any one of the above-described antireflection layer and lens layer.

According to some example embodiments, the optical functional layer 50 may be continuously formed after the process of forming the display panel 10 and/or the input sensing layer 40. In this case, the adhesive layer may not be between the optical functional layer 50 and the display panel 10 and/or the input sensing layer 40.

The display panel 10, the input sensing layer 40, and/or the optical functional layer 50 may include openings. In this regard, FIG. 20A shows that the display panel 10, the input sensing layer 40, and the optical functional layer 50 include first to third openings 10H, 40H, and 50H, respectively, and the three openings, that is, the first to third openings 10H, 40H, and 50H, overlap each other. The first to third openings 10H, 40H, and 50H are located to correspond to the first area OA. According to some example embodiments, one or more of the display panel 10, the input sensing layer 40, and the optical functional layer 50 may not include an opening. For example, any one or two elements selected from the display panel 10, the input sensing layer 40, and the optical functional layer 50 may not include an opening. Alternatively, the display panel 10, the input sensing layer 40, and the optical functional layer 50 may not include an opening as illustrated in FIG. 20B.

As described above, the first area OA may be a kind of component area (e.g., a sensor area, a camera area, a speaker area, etc.) in which a component 20 for adding various functions to the display device 1 is located. The component 20 may be located in the first to third openings 10H, 40H, and 50H as shown in FIG. 20A. Alternatively, the component 20 may be under the display panel 10 as shown in FIG. 20B.

The component 20 may include an electronic component. For example, the component 20 may be an electronic component that uses light or sound. For example, the electronic component may include a sensor that outputs and/or receives light, such as an infrared sensor, a camera that captures an image by receiving light, a sensor that outputs and detects light or sound to measure the distance or recognize fingerprints, a small lamp that outputs light, a speaker that outputs sound, and the like. In the case of an electronic component using light, light of various wavelength bands such as visible light, infrared light, ultraviolet light, and the like may be used. In some embodiments, the first area OA may be a transmission area in which light and/or sound that is output from the component 20 to the outside or that travels from the outside toward the electronic component may be transmitted.

According to some example embodiments, when the display device 1 is used as a smart watch or a vehicle instrument panel, the component 20 may be a member such as a clock needle or a needle indicating certain information (e.g., vehicle speed, etc.). When the display device 1 includes a clock needle or a vehicle instrument panel, the component 20 may be exposed to the outside through the window 60 and the window 60 may include an opening corresponding to the first area OA.

The component 20 may include element(s) associated with the function of the display panel 10 as described above, or may include elements, such as accessories, that increase aesthetics of the display panel 10. According to some example embodiments, an optically transparent adhesive may be between the window 60 and the optical functional layer 50.

FIGS. 21A to 21D are cross-sectional views of a display panel according to some example embodiments.

Figure 21A:
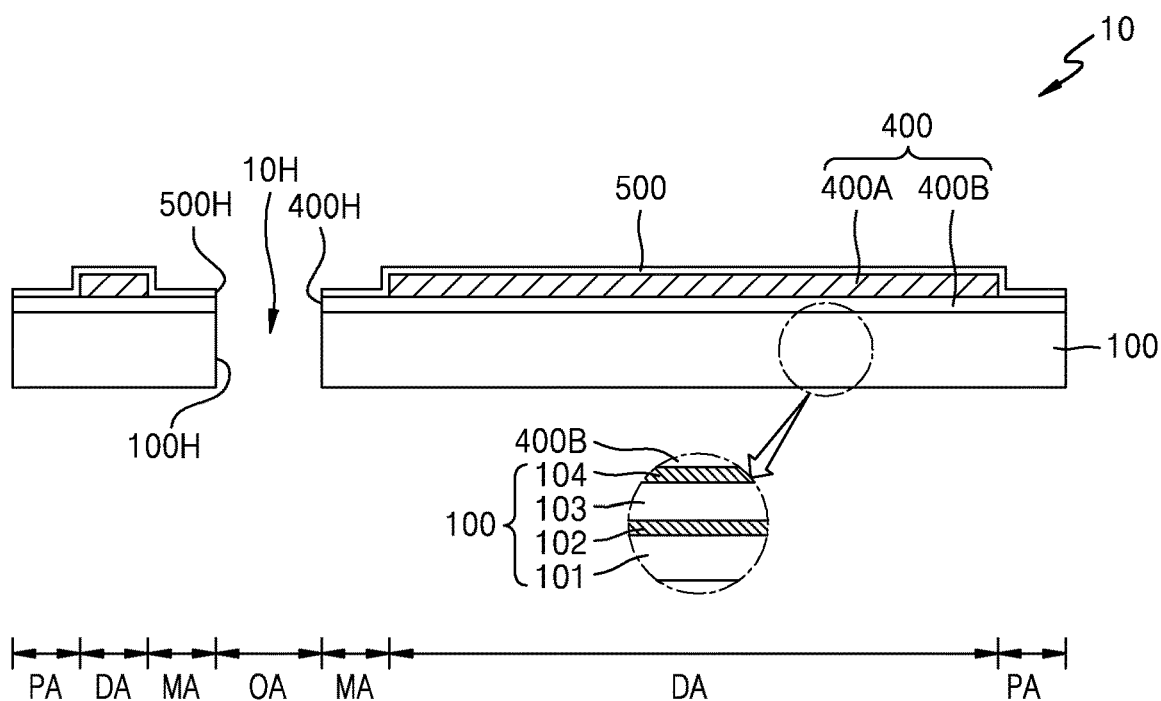

Referring to FIG. 21A, the display panel 10 includes a display layer 400 located on the substrate 100. The display layer 400 may include layers between the substrate 100 and the thin-film encapsulation layer 500.

The substrate 100 may include a glass material or a polymer resin. When the substrate 100 includes a polymer resin, the substrate 100 may be formed in multiple layers. For example, as shown in the enlarged view of FIG. 21A, the substrate 100 may include a first base layer 101, a second barrier layer 102, a second base layer 103, and a second barrier layer 104.

Each of the first base layer 101 and the second base layer 103 may include a polymer resin. For example, the first base layer 101 and the second base layer 103 may include a polymer resin such as PES, PAR, PEI, PEN, PET, PPS, PI, PC, TAC, CAP, and the like. Each of the first base layer 101 and the second base layer 103 may include a transparent polymer resin.

Each of the first and second barrier layers 102 and 104 is a barrier layer for preventing penetration of external foreign matter and may include a single layer or multiple layers including an inorganic material such as silicon nitride and/or silicon oxide.

The display layer 400 includes a plurality of pixels. The display layer 400 may include a display element layer 400A including display elements arranged for each pixel, and a pixel circuit layer 400B including a pixel circuit and insulating layers arranged for each pixel. Each pixel circuit may include a transistor and a storage capacitor, and each display element may include an organic light-emitting diode (OLED).

Display elements of the display layer 400 may be covered by an encapsulation member such as the thin-film encapsulation layer 500, and the thin-film encapsulation layer 500 may include at least one inorganic encapsulation layer and at least one organic encapsulation layer. When the display panel 10 includes the substrate 100 including a polymer resin and the thin-film encapsulation layer 500 including the inorganic encapsulation layer and the organic encapsulation layer, flexibility of the display panel 10 may be improved.

The display panel 10 may include a first opening 10H penetrating the display panel 10. The first opening 10H may be located in the first area OA, in which case the first area OA may be a kind of opening area. FIG. 21A shows that the substrate 100 and the thin-film encapsulation layer 500 include through holes 100H and 500H corresponding to the first opening 10H of the display panel 10, respectively. The display layer 400 may also include a through hole 400H corresponding to the first area OA.

Figure 21B:
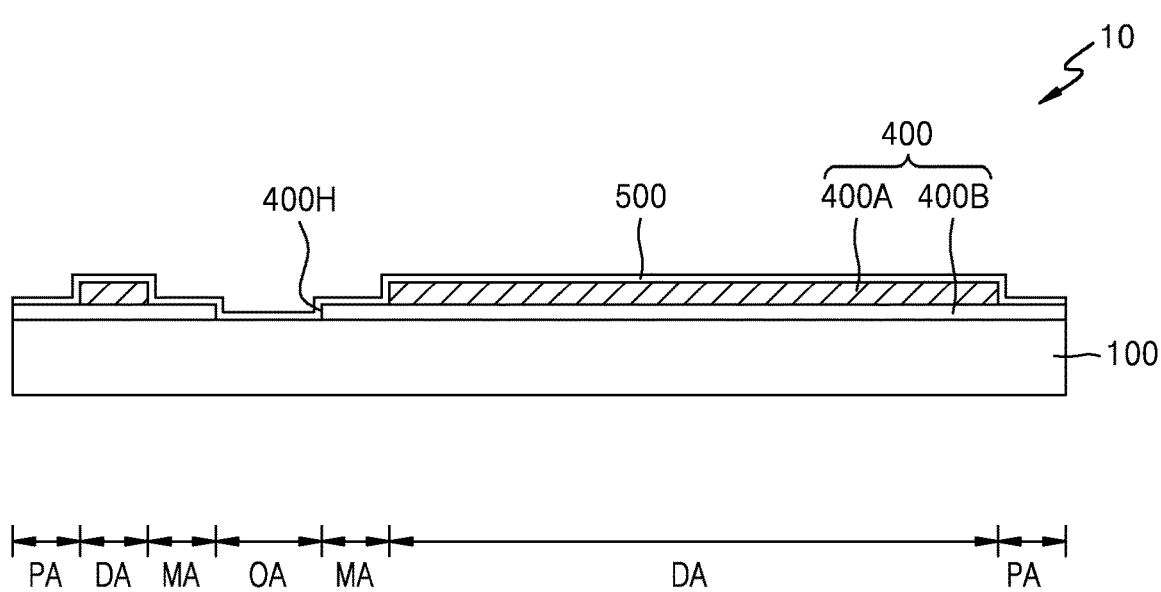

According to some example embodiments, as shown in FIG. 21B, the substrate 100 may not include a through hole corresponding to the first area OA. The display layer 400 may also include the through hole 400H corresponding to the first area OA. The thin-film encapsulation layer 500 may not include a through hole corresponding to the first area OA. According to some example embodiments, as shown in FIG. 21C, the display layer 400 may not include the through hole 400H corresponding to the first area OA, and the display element layer 400A is not located in the first area OA.

FIGS. 21A to 21C show that the display element layer 400A is not located in the first area OA, but the disclosure is not limited thereto. According to some example embodiments, as shown in FIG. 21D, an auxiliary display element layer 400C may be located in the first area OA. The auxiliary display element layer 400C may include a display element that operates in a different structure or/and in a different manner from a display element of the display element layer 400A.

According to some example embodiments, each pixel of the display element layer 400A may include an active organic light-emitting diode, and the auxiliary display element layer 400C may include pixels that include a passive organic light-emitting diode. When the auxiliary display element layer 400C includes a display element of the passive organic light-emitting diode, elements that constitute a pixel circuit may not exist under the passive organic light-emitting diode. For example, a portion of the pixel circuit layer 400B below the auxiliary display element layer 400C does not include a transistor and a storage capacitor.

According to some example embodiments, the auxiliary display element layer 400C may include display elements of the same type (e.g., an active organic light-emitting diode) as the display element layer 400A, but may have a different structure of a pixel circuit thereunder. For example, the pixel circuit under the auxiliary display element layer 400C (e.g., a pixel circuit having a light-shielding film between a substrate and a transistor) may include a structure different from that of the pixel circuit under the display element layer 400A. Alternatively, the display elements of the auxiliary display element layer 400C may operate according to control signals different from those of the display elements of the display element layer 400A. A component (e.g., an infrared sensor, etc.) that does not require relatively high transmittance may be located in the first area OA in which the auxiliary display element layer 400C is located. In this case, the first area OA may be a component area and an auxiliary display area.

FIGS. 22A to 22D are cross-sectional views of a display panel according to some example embodiments. Unlike the display panel 10 described with reference to FIGS. 21A to 21D including the thin-film encapsulation layer 500, a display panel 10' of FIGS. 22A to 22D may include an encapsulation substrate 500A and a sealant 540.

As illustrated in FIGS. 22A to 22C, one or more of the substrate 100, the display layer 400, and the encapsulation substrate 500A may have through holes 100H, 400H, and 500AH corresponding to the first area OA. The display element layer 400A may not be located in the first area OA, or the auxiliary display element layer 400C may be located in the first area OA as shown in FIG. 22D. The auxiliary display element layer 400C has been described above with reference to FIG. 21D.

When the first connection line 201 is directly connected to the data line DL without the second connection line 203, the data driver D_IC needs to output a data signal according to the arrangement of the first connection line 201. In this case, the first to third data signals Dr, Dg, and Db output by the data driver D_IC in the y direction may not be regularly repeated, and the sequence of the first to third data signals Dr, Dg, and Db may be changed. Accordingly, regular gamma correction of the first to third data signals Dr, Dg, and Db may be difficult in the data driver D_IC, and a cost increase may occur due to the development of the data driver D_IC for gamma correction.

Embodiments of the disclosure may reroute data lines to which each of the first connection lines 201 are connected using the second connection lines 203. The first connection lines 201 may be electrically connected to the first to fourth data lines DL1 to DL4 in accordance with the sequence of the first to third data signals Dr, Dg, and Db or the first to fourth data signals Dr, Dg, Db and Dw output by the data driver D_IC by using the second connection lines 203. Therefore, because the sequence of the first to third data signals Dr, Dg, and Db or the first to fourth data signals Dr, Dg, Db and Dw output by the data driver D_IC may be regular, a display device may be manufactured without a cost increase due to the development of the data driver D_IC.

Embodiments of the disclosure are not limited to the above-described arrangement of the second connection lines 203, and the second connection lines 203 may route the first connection line 201 and the data line DL by twice an output channel of the data driver D_IC. For example, in a display device (four output channels) to which the pixel arrays of FIGS. 7 and 16 are applied, the second connection lines 203 may route the first connection line 201 and the data line DL between eight adjacent columns. In a display device (three output channels) to which the pixel array of FIG. 13 is applied, the second connection lines 203 may route the first connection line 201 and the data line DL between twelve adjacent columns.

According to embodiments of the disclosure, as a data line to be connected to a connection line of a display area is rerouted, a display device capable of stably transmitting a data signal to a pixel without increasing manufacturing costs while reducing a dead area of a display device may be provided. However, the scope of the disclosure is not limited to the effect.

It should be understood that example embodiments described herein should be considered in a descriptive sense only and not for purposes of limitation. Descriptions of features or aspects within each embodiment should typically be considered as available for other similar features or aspects in other embodiments. While one or more example embodiments have been described with reference to the figures, it will be understood by those of ordinary skill in the art that various changes in form and details may be made therein without departing from the spirit and scope as defined by the following claims, and their equivalents.

What is claimed is:

1. A display device comprising:
a substrate comprising a display area and a peripheral area outside the display area;
a first connection line in the display area, the first connection line comprising a first portion extending along a first column of the display area, a third portion extending along a second column of the display area, and a second portion connecting the first portion to the third portion; and
a second connection line in the peripheral area and connected to the third portion of the first connection line and a data line in a third column of the display area.

2. The display device of claim 1, wherein the first connection line and the second connection line are on a same layer.

3. The display device of claim 1, wherein the first connection line and the second connection line are on different layers.

4. The display device of claim 1, wherein the data line and the first connection line are on different layers.

5. The display device of claim 1, wherein the data line and the second connection line are on different layers.

6. The display device of claim 1, wherein the data line and the second connection line are on a same layer.

7. The display device of claim 1, further comprising:
a third connection line in the peripheral area and connected to a first pad of a pad area located in the peripheral area and the first portion of the first connection line; and
a fourth connection line in the peripheral area and connected to a second pad of the pad area and a data line in the first column.

8. The display device of claim 7, wherein at least one pad is further between the first pad and the second pad.

9. The display device of claim 7, wherein the first connection line and the third connection line are on a same layer.

10. The display device of claim 7, wherein the data line in the first column and the fourth connection line are on a same layer.

11. The display device of claim 1, further comprising:
a pixel electrode on an upper layer of the first connection line.

12. The display device of claim 1, wherein the third column is immediately adjacent to the second column.

13. The display device of claim 1, wherein the third column is apart from the second column by a plurality of columns.

14. The display device of claim 1, further comprising:
a third connection line in the peripheral area and connected to a first pad of a pad area located in the peripheral area and the first portion of the first connection line; and
a fourth connection line in the peripheral area and connected to a second pad of the pad area and a data line in a fourth column of the display area.

15. A display device comprising:
a substrate comprising a display area and a peripheral area outside the display area;
a plurality of data lines in the display area;
a plurality of first connection lines in the display area; and
a plurality of second connection lines in the peripheral area,
wherein each of the first connection lines comprises a first portion and a third portion extending in a first direction and spaced apart from each other by at least one column and a second portion extending in a second direction different from the first direction and connecting the first portion to the third portion, and
each of the second connection lines is connected to a third portion of one of the first connection lines and a data line in a column spaced apart by at least one column from the third portion of one of the first connection lines.

16. The display device of claim 15, wherein
the second connection lines are on a layer different from a layer where the first connection lines are arranged.

17. The display device of claim 15, wherein each of the second connection lines is a portion where each of the first connection lines is extended from the display area to the peripheral area.

18. The display device of claim 15, wherein
a plurality of third connection lines are in the peripheral area; and
a plurality of fourth connection lines are in the peripheral area,
wherein each of the third connection lines is connected to a first pad of a pad area in the peripheral area and a first portion of one of the first connection lines, and
each of the fourth connection lines is in the peripheral area and connected to a second pad of the pad area and one of the data lines.

19. The display device of claim 15, wherein the first portion and the third portion of one of the first connection lines are immediately adjacent by one column, and the first portion and the third portion of others of the first connection lines are apart from each other by a plurality of columns.

* * * * *